(12) United States Patent
Kim et al.

(10) Patent No.: US 12,069,390 B2
(45) Date of Patent: Aug. 20, 2024

(54) PIXEL ARRAY AND DEVICES INCLUDING THE SAME

(71) Applicant: SAMSUNG ELECTRONICS CO., LTD., Suwon-si (KR)

(72) Inventors: Hwanwoong Kim, Suwon-si (KR); Jihun Kim, Suwon-si (KR); Jung Bin Yun, Suwon-si (KR); Seungjoon Lee, Suwon-si (KR); Hongsuk Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/984,086

(22) Filed: Nov. 9, 2022

(65) Prior Publication Data

US 2023/0144373 A1    May 11, 2023

(30) Foreign Application Priority Data

Nov. 10, 2021 (KR) .................. 10-2021-0154253
Aug. 12, 2022 (KR) .................. 10-2022-0101597

(51) Int. Cl.
*H04N 25/75* (2023.01)
*H01L 27/146* (2006.01)
*H04N 25/77* (2023.01)

(52) U.S. Cl.
CPC ......... *H04N 25/77* (2023.01); *H01L 27/1463* (2013.01); *H04N 25/75* (2023.01)

(58) Field of Classification Search
CPC ........ H04N 25/77; H04N 25/75; H04N 25/79; H04N 25/59; H04N 25/78; H01L 27/1463; H01L 27/14603; H01L 27/14609; H01L 27/14612; H01L 27/14614; H01L 27/14621; H01L 27/14627; H01L 27/1464; H01L 27/14641; H01L 27/14643

See application file for complete search history.

(56) References Cited

U.S. PATENT DOCUMENTS

| | | | |
|---|---|---|---|
| 9,019,410 B2 | 4/2015 | Lim et al. | |
| 9,247,170 B2 | 1/2016 | Komori et al. | |
| 10,510,796 B1 | 12/2019 | Wang et al. | |
| 11,050,966 B2 | 6/2021 | Mori et al. | |
| 11,114,482 B2 | 9/2021 | Ma et al. | |
| 2014/0078368 A1* | 3/2014 | Komori | H04N 25/77 348/307 |

(Continued)

*Primary Examiner* — Mekonnen D Dagnew
(74) *Attorney, Agent, or Firm* — Sughrue Mion, PLLC

(57) ABSTRACT

A pixel array including pixels arranged in a matrix shape is provided. The pixels have a same structure and are separated from each other by front deep trench isolation (FDTI). A first pixel among the pixels includes a first floating diffusion region, a first group of photoelectric conversion elements, a first group of charge transfer transistors, a first source follower transistor, and a first transistor, a second transistor, and a first reset transistor connected in series between the first floating diffusion region and a voltage supply line. One of the first transistor, the second transistor, and the first reset transistor is formed in a first sub-pixel region. At least another one of the first transistor, the second transistor, and the first reset transistor is formed in a second sub-pixel region. The first sub-pixel region and the second sub-pixel region are separated from each other by the FDTI.

20 Claims, 14 Drawing Sheets

(56) References Cited

U.S. PATENT DOCUMENTS

2019/0158767 A1    5/2019  Wolfs et al.
2020/0387050 A1*  12/2020  Pyo .................. H01L 27/14627
2021/0136303 A1    5/2021  Kim et al.
2021/0144315 A1*  5/2021  Yun ................... H01L 27/14641
2024/0072092 A1*  2/2024  Lim .................. H01L 27/14636

* cited by examiner

PIXEL ARRAY AND DEVICES INCLUDING THE SAME

CROSS-REFERENCE TO RELATED APPLICATIONS

This application claims priority under 35 U.S.C. § 119 to Korean Patent Application No. 10-2021-0154253 filed on Nov. 10, 2021, and Korean Patent Application No. 10-2022-0101597 filed on Aug. 12, 2022, in the Korean Intellectual Property Office, the disclosures of which are incorporated by reference herein in their entireties.

BACKGROUND

The present disclosure relates to a pixel array, and more particularly, relate to a pixel array including a pixel including three transistors connected in series between a voltage supply line and a floating diffusion region to adjust a conversion gain and devices including the same.

In general, an image sensor converts an optical image into an electrical signal. With the development of the computer industry and the communication industry, the demand on image sensors with improved performance in various fields is increasing. An image sensor is classified as a charge coupled device (CCD) image sensor or a complementary metal-oxide-semiconductor (CMOS) image sensor.

The CMOS image sensor is easy to drive and makes it possible to miniaturize the product because a signal processing circuit is capable of being integrated into a single chip. Because the power consumption of the CMOS image sensor is very little, it is easy to apply the CMOS image sensor to products with the limited battery capacity. In addition, because the CMOS image sensor is capable of being manufactured by using the CMOS process technology, the costs for manufacturing may be reduced. Accordingly, the use of the CMOS image sensor is rapidly increasing as the high resolution is implemented together with the technology development.

The CMOS image sensor is implemented with a single chip where a pixel array including pixels each generating an analog pixel signal and a readout circuit for reading the analog pixel signal are coupled. The analog pixel signal generated by the pixel is converted into a digital pixel signal through an analog-to-digital converter included in the readout circuit and is then read out. The specification of the readout circuit is determined depending on how quickly an analog pixel signal is converted into a digital pixel signal without loss in the analog-to-digital conversion process and how quickly it is read out.

SUMMARY

Provided are an image sensor capable of performing a triple-conversion gain mode to optimize a dynamic range, a signal-to-noise ratio (SNR), and a noise, and an imaging device including the same.

According to an aspect of an example embodiment, a pixel array includes: pixels arranged in a matrix shape and separated from each other by front deep trench isolation (FDTI), each of the pixels having a same structure, wherein a first pixel among the pixels includes: a first floating diffusion region; a first group of photoelectric conversion elements that are separated from each other by the FDTI; a first group of charge transfer transistors respectively including vertical transfer gates, the first group of charge transfer transistors being configured to transfer photo-generated charges generated by the first group of photoelectric conversion elements to the first floating diffusion region; a first source follower transistor including a first gate connected with the first floating diffusion region; and a first transistor, a second transistor, and a first reset transistor connected in series, between the first floating diffusion region and a voltage supply line supplying a pixel power supply voltage, to adjust a first conversion gain of the first source follower transistor, wherein a first one of the first transistor, the second transistor, and the first reset transistor is provided in a first sub-pixel region of the first pixel together with a first photoelectric conversion element among the first group of photoelectric conversion elements, wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and wherein the first sub-pixel region and the second sub-pixel region are separated from each other by the FDTI.

According to an aspect of an example embodiment, an image sensor includes: a pixel array including pixels arranged in a matrix shape and separated from each other front deep trench isolation (FDTI), each of the pixels having a same structure; and an analog-to-digital converter configured to convert an analog pixel signal output from the pixel array into a digital signal, wherein a first pixel among the pixels includes: a first floating diffusion region; a first group of photoelectric conversion elements that are separated from each other by the FDTI; a first group of charge transfer transistors respectively including vertical transfer gates, the first group of charge transfer transistors being configured to transfer photo-generated charges generated by the first group of photoelectric conversion elements to the first floating diffusion region; a first source follower transistor including a first gate connected with the first floating diffusion region; and a first transistor, a second transistor, and a first reset transistor connected in series between the first floating diffusion region and a voltage supply line supplying a pixel power supply voltage, to adjust a first conversion gain of the first source follower transistor, wherein a first one of the first transistor, the second transistor, and the first reset transistor is provided in a first sub-pixel region of the first pixel together with a first photoelectric conversion element among the first group of photoelectric conversion elements, wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and wherein the first sub-pixel region and the second sub-pixel region are separated from each other by the FDTI.

According to an aspect of an example embodiment, an image processing device includes: an image sensor; and a processor configured to control an operation of the image sensor, wherein the image sensor includes: a pixel array including pixels arranged in a matrix shape and separated from each other front deep trench isolation (FDTI), each of the pixels having a same structure; and an analog-to-digital converter configured to convert an analog pixel signal output from the pixel array into a digital signal, wherein a first pixel among the pixels includes: a first floating diffusion region; a first group of photoelectric conversion elements that are separated from each other by the FDTI; a first group of charge transfer transistors respectively including vertical transfer gates, the first group of charge transfer transistors being configured to transfer photo-generated charges generated by the first group of photoelectric conversion elements to the first floating diffusion region; a first source follower transistor including a first gate connected with the first floating diffusion region; and a first transistor, a second transistor, and a first reset transistor connected in series between the first floating diffusion region and a voltage supply line supplying a pixel power supply voltage, to adjust a first conversion gain of the first source follower transistor, wherein a first one of the first transistor, the second transistor, and the first reset transistor is provided in a first sub-pixel region of the first pixel together with a first photoelectric conversion element among the first group of photoelectric conversion elements, wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and wherein the first sub-pixel region and the second sub-pixel region are separated from each other by the FDTI.

BRIEF DESCRIPTION OF THE FIGURES

The above and other aspects and features of the present disclosure will become apparent by describing in detail embodiments thereof with reference to the accompanying drawings, in which.

DETAILED DESCRIPTION

Figure 3A:
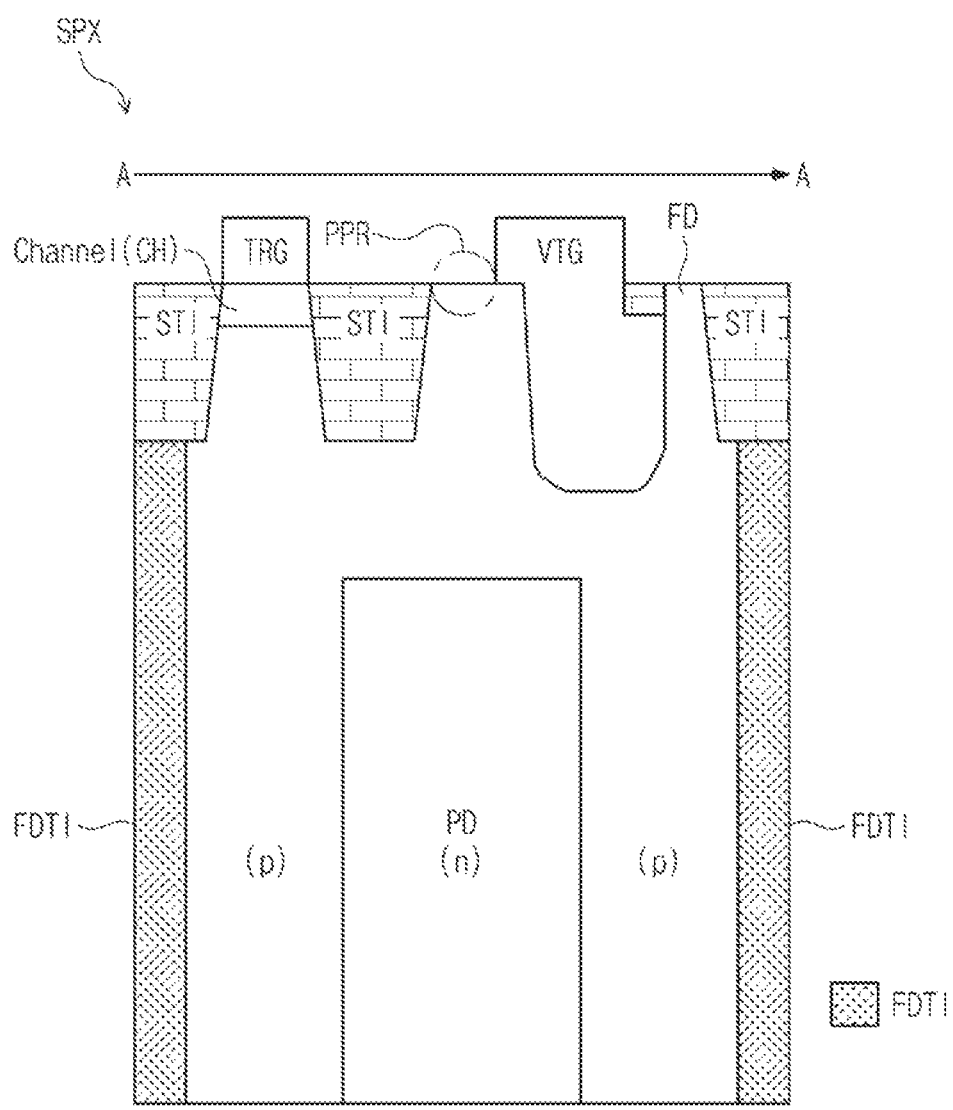
FIG. 3A is a cross-sectional view of a sub-pixel region having an FDTI structure according to an embodiment of the present disclosure and including a transistor, a photoelectric conversion element, a vertical transfer gate, and a floating diffusion region.

The front deep trench isolation or frontside deep trench isolation (FDTI) is a DTI that is formed from a first surface, on/in which transistors are formed, toward a second surface opposite to the first surface in the process of manufacturing an image sensor, as illustrated in FIG. 3A, for the purpose of isolating pixels.

An FDTI region (also called a "FDTI structure") is a region (also called a "structure") that is vertically expanded (or formed) from a first surface of a semiconductor substrate (e.g., an epitaxial layer) toward a second surface opposite to the first surface. Herein, the FDTI region or the FDTI material is simply referred to as "FDTI".

Figure 1:
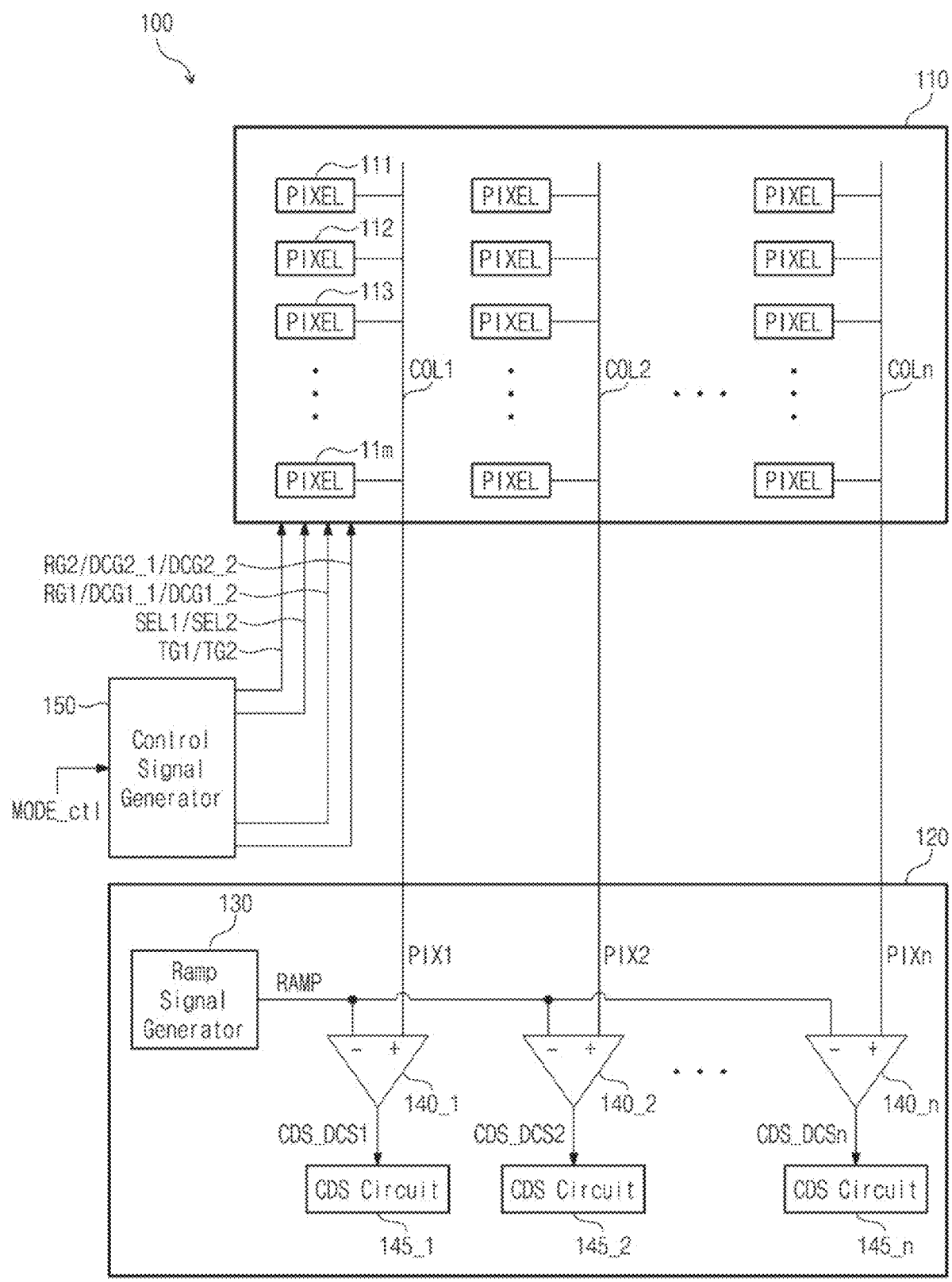
FIG. 1 is a block diagram of an image sensor including a pixel array according to an embodiment of the present disclosure.

FIG. 1 is a block diagram of an image sensor including a pixel array according to an embodiment of the present disclosure. Referring to FIG. 1, an image sensor 100 includes a pixel array 110, a readout circuit 120, and a control signal generator 150.

The image sensor 100 may be a complementary metal-oxide-semiconductor (CMOS) image sensor and may be also called a solid-state imaging device.

The pixel array (also called an active pixel sensor (APS) array) 110 includes a plurality of pixels PIXEL arranged in the shape of a matrix with dimension m×n. The plurality of pixels PIXEL have the same structure and are isolated from each other by the FDTI. The plurality of pixels PIXEL perform photoelectric conversion and output pixel signals (or analog pixel signals) PIX1 to PIXn depending on the photoelectric conversion to the readout circuit 120. d The readout circuit (also called an analog-to-digital converter) 120 includes a ramp signal generator 130, a plurality of comparators 140_1 to 140_n, and a plurality of correlated double sampling (CDS) circuits 145_1 to 145_n.

The ramp signal generator 130 generates a ramp signal RAMP. For example, the ramp signal generator 130 may be a digital-to-analog converter.

The ramp signal RAMP is applied to the comparators 140_1 to 140_n, and the comparators 140_1 to 140_n receive the pixel signals PIX1 to PIXn transferred through pixel lines (or output lines) COL1 to COLn, compare the pixel signals PIX1 to PIXn with the ramp signal RAMP, and output comparison signals CDS_DCS1 to CDS_DCSn depending on comparison results.

The comparators 140_1 to 140_n compare reset signals (or reset components) and light-sensed signals (or signal components) included in the pixel signals PIX1 to PIXn with the ramp signal RAMP and output the comparison signals CDS_DCS1 to CDS_DCSn depending on the comparison results.

According to an embodiment, the ramp signal RAMP is input to a first input terminal (e.g., an inverting input terminal) of each of the comparators 140_1 to 140_n and each of the pixel signals PIX1 to PIXn is input to a second input terminal (e.g., a non-inverting input terminal) of each of the comparators 140_1 to 140_n.

According to embodiments, the ramp signal RAMP may be input to the second input terminal of each of the comparators 140_1 to 140_n, and each of the pixel signals PIX1 to PIXn may be input to the first input terminal of each of the comparators 140_1 to 140_n.

The CDS circuits 145_1 to 145_n count times that are taken for the comparison signals CDS_DCS1 to CDS_DCSn to transition from the first state to the second state and may output count values. Herein, the first state may be one of a low level and a high level, and the second state may be the other of the low level and the high level.

The control signal generator 150 may generate control signals TG1, TG2, SEL1, SEL2, RG1, DCG1_1, DCG1_2, RG2, DCG2_1, and DCG2_2 to be described with reference to FIGS. 7 and 9 depending on a mode control signal MODE_ctl and may output the control signals to each pixel "PIXEL" included in the pixel array 110.

For convenience of description, the control signals TG1, TG2, SEL1, SEL2, RG1, DCG1_1, DCG1_2, RG2, DCG2_1, and DCG2_2 for controlling a first pixel 112 and a second pixel 113 are illustrated in FIG. 1 as an example.

Figure 2:
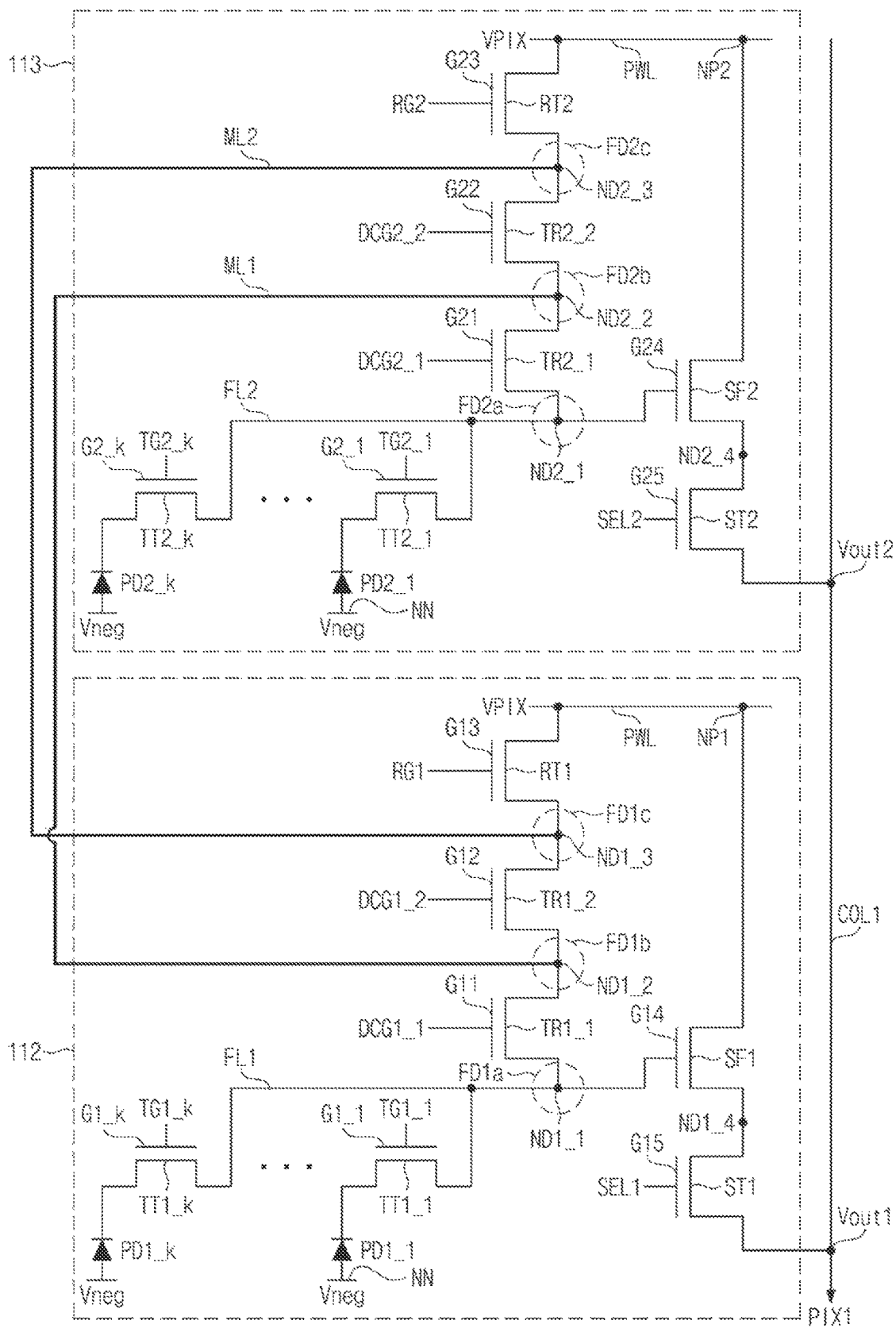
FIG. 2 is a circuit diagram of a first pixel and a second pixel of FIG. 1, which are connected through two connection lines.

FIG. 2 is a circuit diagram of a first pixel and a second pixel of FIG. 1, which are connected through two connection lines. Referring to FIGS. 1 and 2, the image sensor 100 includes the first pixel 112 and the second pixel 113. For convenience of description, dummy transistors are not illustrated in FIG. 2.

As the first pixel 112 is formed (or manufactured) by using the FDTI process, three transistors (i.e., a first transistor TR1_1, a second transistor TR1_2, and a first reset transistor RT1) that are connected in series are connected between a first floating diffusion node ND1_1 and a first voltage node NP1. The first floating diffusion node ND1_1 is connected with a first floating diffusion region FD1a, and the first voltage node NP1 is connected with a voltage supply line PWL supplying a pixel power supply voltage VPIX. A node is formed by using at least one metal contact.

To adjust a first conversion gain of a first source follower transistor SF1, the first pixel 112 includes the three transistors TR1_1, TR1_2, and RT1 connected in series between the first floating diffusion node ND1_1 and the first voltage node NP1.

The first transistor TR1_1 is connected between a first connection node ND1_2 and the first floating diffusion node ND1_1, and a first conversion gain control signal DCG1_1 is supplied to a gate G11 of the first transistor TR1_1. A gate is also called a gate electrode. The first connection node ND1_2 is connected with a second floating diffusion region FD1b.

The second transistor TR1_2 is connected between the first connection node ND1_2 and a second connection node ND1_3, and a second conversion gain control signal DCG1_2 is supplied to a gate G12 of the second transistor TR1_2. The second connection node ND1_3 is connected with a third floating diffusion region FD1c.

The first reset transistor RT1 is connected between the first voltage node NP1 and the second connection node ND1_3, and a first reset signal RG1 is supplied to a gate G13 of the first reset transistor RT1.

The first pixel 112 further includes a first group of charge transfer transistors TT1_1 to TT1_k (k being a natural number of 2 or more), the first source follower transistor SF1, and a first select transistor ST1.

The charge transfer transistors TT1_1 to TT1_k of the first group may transfer photo-generated charges generated by a first group of photoelectric conversion elements PD1_1 to PD1_k to the first floating diffusion region FD1a, and the photoelectric conversion elements PD1_1 to PD1_k of the first group are separated from each other by the FDTI.

The charge transfer transistors TT1_1 to TT1_k may transfer the photo-generated charges generated by the photoelectric conversion elements PD1_1 to PD1_k to the first floating diffusion region FD1a in response to charge transfer control signals TG1_1 to TG1_k respectively supplied to gates G1_1 to G1_k thereof. Each of the gates G1_1 to G1_k may be a vertical transfer gate (VTG).

When each of the photoelectric conversion elements PD1_1 to PD1_k is a photodiode, a second terminal (e.g., an anode) of the photodiode may be connected with a negative voltage supply line NN supplying a first negative voltage Vneg (e.g., −0.6 V).

A gate G14 of the first source follower transistor SF1 is connected with the first floating diffusion node ND1_1, and the first source follower transistor SF1 is connected between the first voltage node NP1 and a fifth connection node ND1_4.

The first select transistor ST1 is connected between the fifth connection node ND1_4 and a first output node Vout1, a first selection signal SEL1 is supplied to a gate G15 of the first select transistor ST1, and the first output node Vout1 is connected with a first pixel line COL1.

As the second pixel 113 is formed (or manufactured) by using the FDTI process, three transistors (i.e., a third transistor TR2_1, a fourth transistor TR2_2, and a second reset transistor RT2) that are connected in series are connected between a fourth floating diffusion node ND2_1 and a second voltage node NP2. The fourth floating diffusion node ND2_1 is connected with a fourth floating diffusion region FD2a, and the second voltage node NP2 is connected with the voltage supply line PWL. The first voltage node NP1 and the second voltage node NP2 are connected with each other through a metal contact.

To adjust a second conversion gain of a second source follower transistor SF2, the second pixel 113 includes the three transistors TR2_1, TR2_2, and RT2 connected in series between the fourth floating diffusion node ND2_1 and the second voltage node NP2.

As expressed by Equation 1 below, the conversion gain (CG) means a ratio of μN per e− supplied to each of the gates G14 and G24 of the source follower transistors SF1 and SF2 of the first and second pixels 112 and 113.

$$CG = \frac{\mu V}{e^-} \quad \text{[Equation 1]}$$

The third transistor TR2_1 is connected between a third connection node ND2_2 and the fourth floating diffusion node ND2_1, and a third conversion gain control signal DCG2_1 is supplied to a gate G21 of the third transistor TR2_1. The third connection node ND2_2 is connected with a fifth floating diffusion region FD2b through a metal contact.

The fourth transistor TR2_2 is connected between the third connection node ND2_2 and a fourth connection node ND2_3, and a fourth conversion gain control signal DCG2_2 is supplied to a gate G22 of the fourth transistor TR2_2. The fourth connection node ND2_3 is connected with a sixth floating diffusion region FD2c through a metal contact.

The second reset transistor RT2 is connected between the second voltage node NP2 and the fourth connection node ND2_3, and a second reset signal RG2 is supplied to a gate G23 of the second reset transistor RT2.

The second pixel 113 further includes a second group of charge transfer transistors TT2_1 to TT2_k, the second source follower transistor SF2, and a second select transistor ST2.

The charge transfer transistors TT2_1 to TT2_k of the second group may transfer photo-generated charges generated by a second group of photoelectric conversion elements PD2_1 to PD2_k to the fourth floating diffusion region FD2a, and the photoelectric conversion elements PD2_1 to PD2_k of the second group are separated from each other by the FDTI.

The charge transfer transistors TT2_1 to TT2_k may transfer the photo-generated charges generated by the photoelectric conversion elements PD2_1 to PD2_k to the fourth floating diffusion region FD2a in response to charge transfer control signals TG2_1 to TG2_k respectively supplied to gates G2_1 to G2_k thereof. Each of the gates G2_1 to G2_k may be a vertical transfer gate (VTG).

When each of the photoelectric conversion elements PD2_1 to PD2_k is a photodiode, a second terminal (e.g., an anode) of the photodiode may be connected with the negative voltage supply line NN supplying the first negative voltage Vneg.

A gate G24 of the second source follower transistor SF2 is connected with the fourth floating diffusion node ND2_1, and the second source follower transistor SF2 is connected between the second voltage node NP2 and a sixth connection node ND2_4.

The second select transistor ST2 is connected between the sixth connection node ND2_4 and a second output node Vout2, a second selection signal SEL2 is supplied to a gate G25 of the second select transistor ST2, and the second output node Vout2 is connected with the first pixel line COL1.

A first connection line ML1 electrically connects the first connection node ND1_2 with the third connection node ND2_2, and a second connection line ML2 electrically connects the second connection node ND1_3 with the fourth connection node ND2_3.

For convenience of description, even though the connection lines ML1 and ML2 are illustrated in FIG. 2 as disposed outside of the pixels 112 and 113, the connection lines ML1 and ML2 may be disposed in a metal wiring layer of the pixel array 110.

Below, an operation of each of the first pixel 112 and the second pixel 113 will be described.

When the reset transistors RT1 and RT2 are turned on in a state where the transistors TR1_1, TR1_2, TR2_1, and TR2_2 are turned on, potentials of the floating diffusion regions FD1a and FD2a become a level of the pixel power supply voltage VPIX.

When the light is incident onto the photoelectric conversion elements PD1_1 to PD1_k and PD2_1 to PD2_k, each of the photoelectric conversion elements PD1_1 to PD1_k and PD2_1 to PD2_k generates electron-hole pairs (EHPs), for example, photo-generated charges. Each of the photoelectric conversion elements PD1_1 to PD1_k and PD2_1 to PD2_k may be a photodiode, a phototransistor, a photogate, or a pinned photodiode, but embodiments of the present disclosure is not limited thereto.

When the charge transfer transistors TT1_1 to TT1_k are turned on depending on the charge transfer control signals TG1_1 to TG1_k, the photo-generated charges generated by the photoelectric conversion elements PD1_1 to PD1_k are transferred to the floating diffusion region FD1a; when the charge transfer transistors TT2_1 to TT2_k are turned on depending on the charge transfer control signals TG2_1 to TG2_k, the photo-generated charges generated by the photoelectric conversion elements PD2_1 to PD2_k are transferred to the floating diffusion region FD2a.

As the photo-generated charges are transferred to the floating diffusion regions FD1a and FD2a, gate voltages that are supplied to the gates G14 and G24 of the source follower transistors SF1 and SF2 change. When each of the select transistors ST1 and ST2 is turned on, a potential change of a source terminal of each of the source follower transistors SF1 and SF2 is output to the first pixel line COL1 as the first pixel signal PIX1.

Each of the transistors TR1_1, TR1_2, RT1, TR2_1, TR2_2, RT2, SF1, SF2, ST1, and ST2 may be implemented with an NMOSFET or PMOSFET. Each of the transistors TR1_1, TR1_2, RT1, TR2_1, TR2_2, RT2, SF1, SF2, ST1, and ST2 may include a first electrode and a second electrode; each of electrodes of the transistors TR1_1, TR1_2, RT1, TR2_1, TR2_2, RT2, SF1, SF2, ST1, and ST2 that are respectively connected with the nodes ND1_1, ND1_2, ND1_3, ND2_1, ND2_2, ND2_3, NP1, and NP2 may be one of the first electrode and the second electrode.

Depending on whether a transistor is an NMOSFET or a PMOSFET, the first electrode is one of a drain electrode and a source electrode, and the second electrode is the other of the drain electrode and the source electrode.

FIG. 3A is a cross-sectional view of a sub-pixel region having an FDTI structure according to an embodiment of the present disclosure and including a transistor, a photoelectric conversion element, a vertical transfer gate, and a floating diffusion region. The cross-sectional view of FIG. 3A is a conceptual diagram for describing the layout of at least one transistor, a photodiode, a vertical transfer gate VTG, and a floating diffusion region FD included in each of sub-pixel regions of FIGS. 4A, 5A, and 6A.

Referring to FIG. 3A, a sub-pixel region (also called a sub-pixel) SPX having the FDTI structure includes a transistor including a channel CH and a gate TRG, a photodiode PD, a vertical transfer gate VTG, and a floating diffusion region FD. In FIG. 3A, "n" means an n-type material, and "p" means a p-type material.

As illustrated in FIG. 3A, the channel CH of the transistor and the floating diffusion region FD are separated by a shallow trench isolation (STI) material (e.g., silicon dioxide (SiO2)).

Figure 3B:
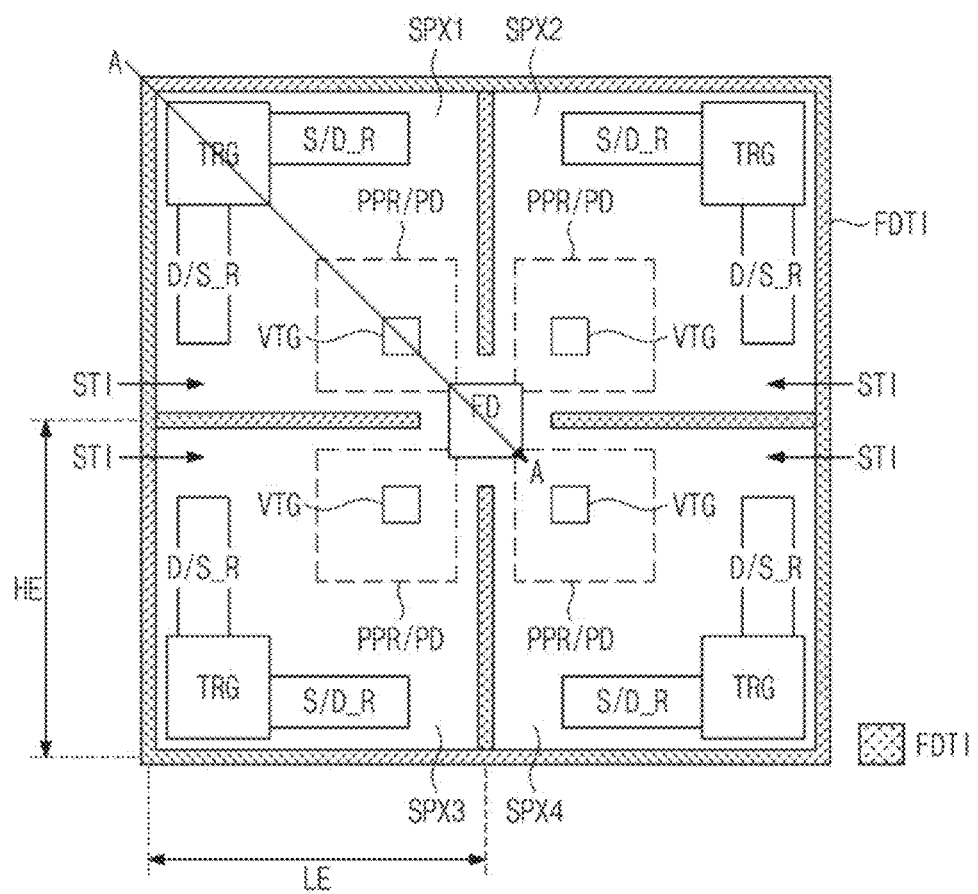
FIG. 3B is a plan view of a sub-pixel region corresponding to the cross-sectional view illustrated in FIG. 3A.

FIG. 3B is a plan view of a sub-pixel region corresponding to the cross-sectional view illustrated in FIG. 3A.

A plan view of a pixel including four sub-pixel regions SPX1 to SPX4 is illustrated as an example, and the four sub-pixel regions SPX1 to SPX4 have the same structure. The four sub-pixel regions SPX1 to SPX4 are not completely separated by the FDTI. As such, charge transfer transistors formed in different sub-pixel regions may share the floating diffusion region FD.

The sub-pixel region SPX1 includes the gate TRG of the transistor, the photodiode PD or a photodiode portion region PPR, and the vertical transfer gate VTG, along direction A-A' illustrated in FIGS. 3A and 3B. The four sub-pixel regions SPX1 to SPX4 have the same horizontal length LE and the same vertical length HE.

As the vertical transfer gate VTG is formed for each of the sub-pixel regions SPX1 to SPX4, it is easy to separate the transistor from the floating diffusion region FD, and thus, the limitation on the spatial layout of the transistor decreases.

Referring to FIG. 3B, the transistor including the gate TRG includes a source/drain region S/D_R and a drain/ source region D/S_R. Herein, the source/drain region S/D_R is connected with a first electrode, and the drain/source region D/S_R is connected with a second electrode.

Figure 4A:
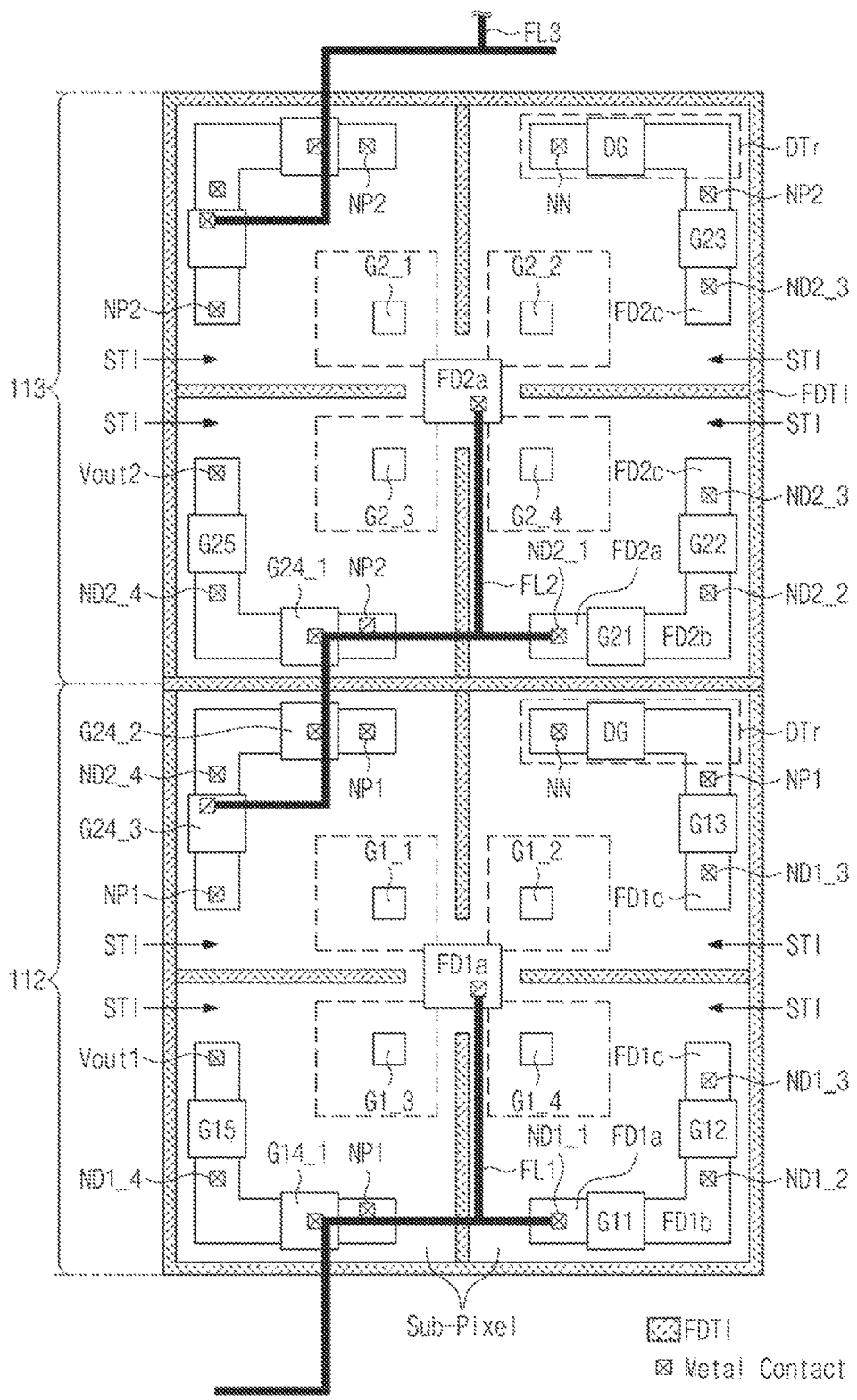
FIG. 4A is a plan view of a first pixel and a second pixel, each of which includes four photoelectric conversion elements.
Figure 5A:
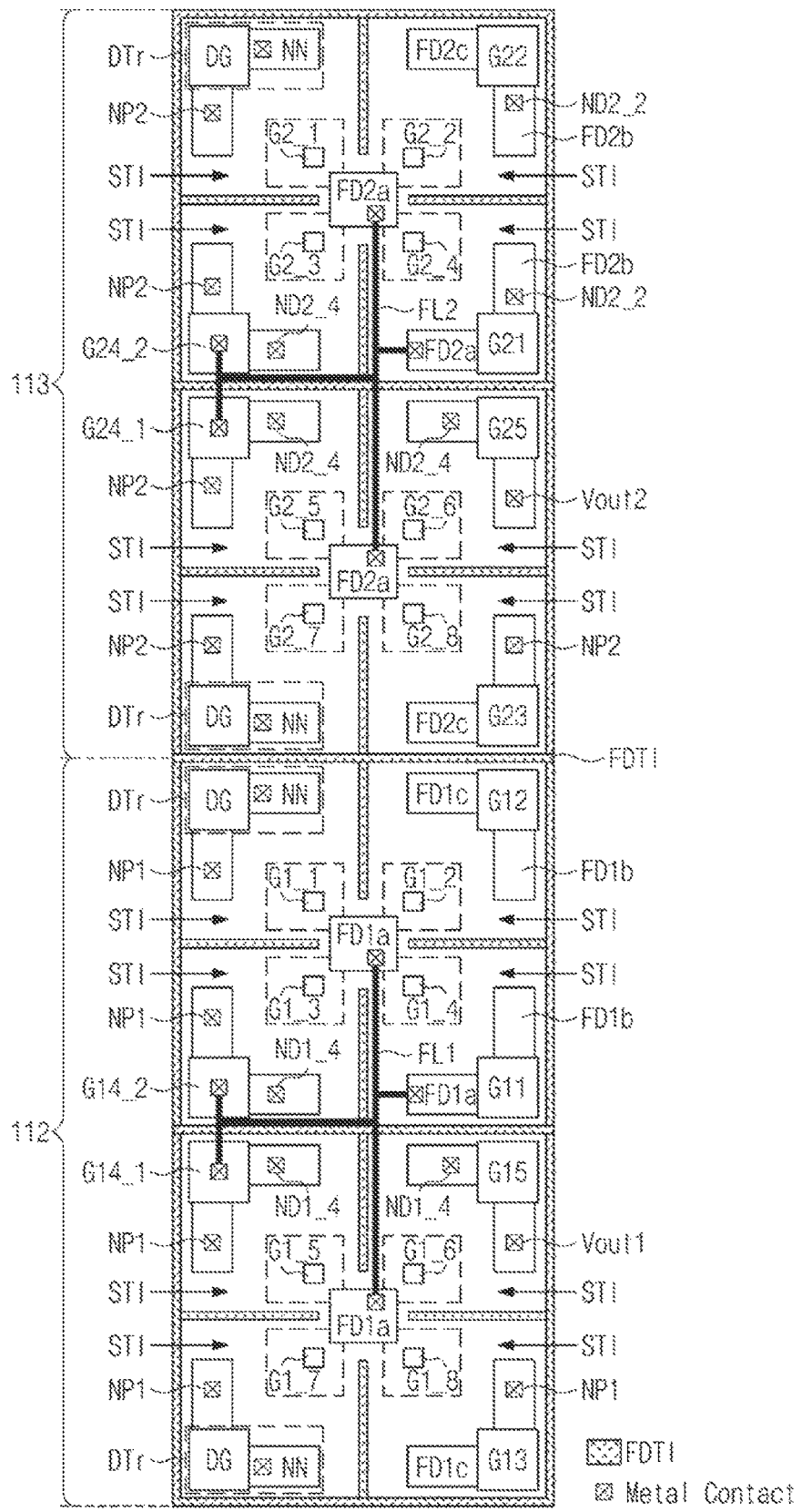
FIG. 5A is a plan view of a first pixel and a second pixel, each of which includes eight photoelectric conversion elements.
Figure 6A:
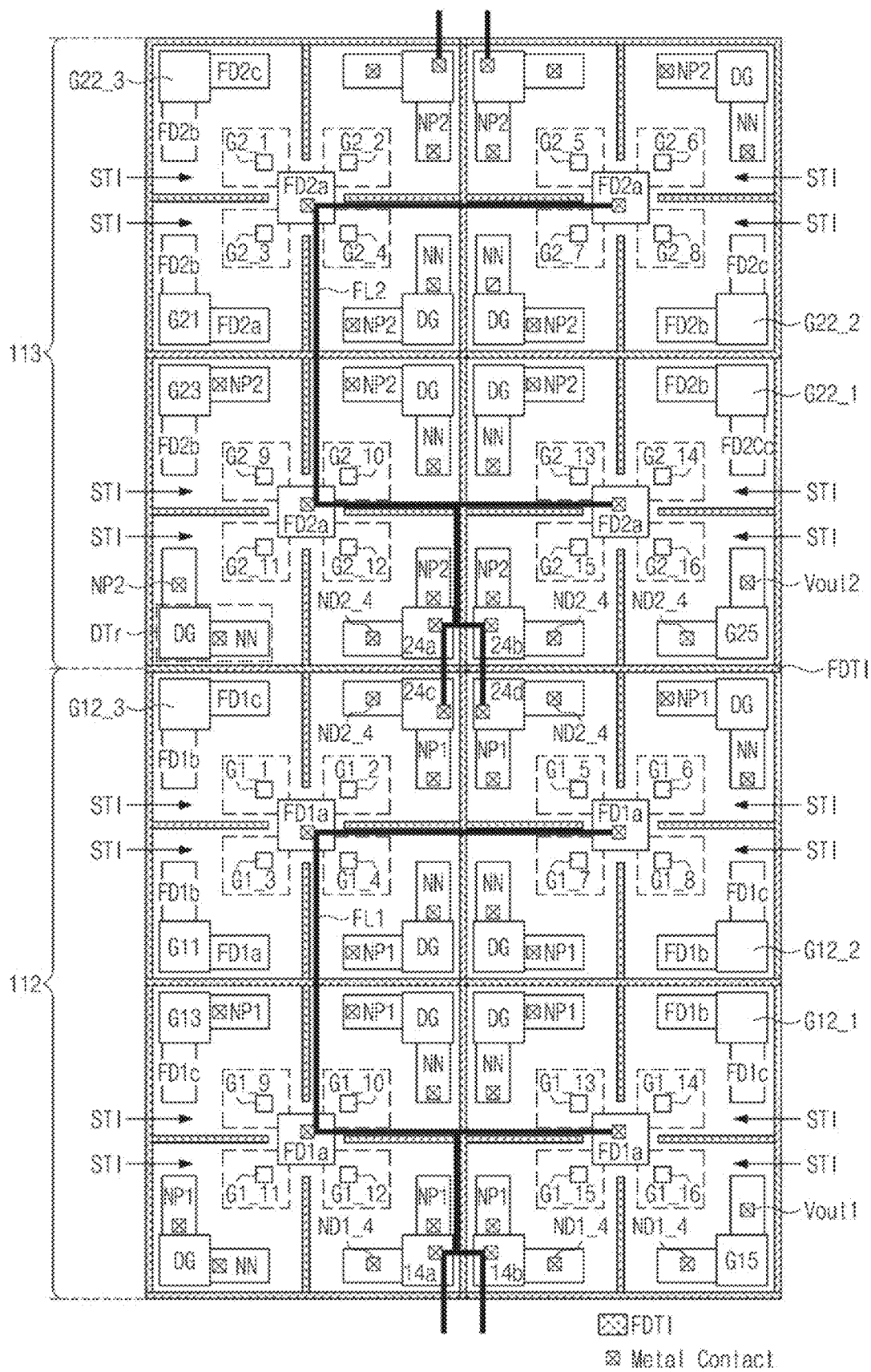
FIG. 6A is a plan view of a first pixel and a second pixel, each of which includes 16 photoelectric conversion elements.

"VTG" illustrated in FIGS. 3A and 3B corresponds to gates G1_1 to G1_4 and G2_1 to G2_4 illustrated in FIG. 4A, corresponds to gates G1_1 to G1_8 and G2_1 to G2_8 illustrated in FIG. 5A, and corresponds to gates G1_1 to G1_16 and G2_1 to G2_16 illustrated in FIG. 6A.

"FD" illustrated in FIGS. 3A and 3B corresponds to floating diffusion regions FD1a and FD_1b illustrated in FIGS. 4A, 5A, and 6A.

"TRG" illustrated in FIGS. 3A and 3B corresponds to gates G11, G12, G13, G14_1, G15, DG, G21, G22, G23, G24_1, G24_2, G24_3, and G25 illustrated in FIG. 4A, corresponds to gates G11, G12, G13, G14_1, G14_2, G15, DG, G21, G22, G23, G24_1, G24_2, and G25 illustrated in FIG. 5A, and corresponds to gates G11, G12_1, G12_2, G12_3, G13, 14a, 14b, G15, DG, G21, G22_1, G22_2, G22_3, G23, 24a, 24b, 24c, 24d, and G25 illustrated in FIG. 6A.

FIG. 4A is a plan view of a first pixel and a second pixel, each of which includes four photoelectric conversion elements. Referring to FIGS. 2, 3A, 3B, and 4A, the structure of the first pixel 112 is identical to the structure of the second pixel 113. The first pixel 112 includes four sub-pixel regions, and the second pixel 113 includes four sub-pixel regions. Components included in each sub-pixel region may be understood from the description given with reference to FIG. 2.

Referring to FIGS. 2 and 4A, depending on the FDTI process, the four photoelectric conversion elements PD1_1 to PD1_4 and the four charge transfer transistors TT1_1 to TT1_4 are formed in the first pixel 112, and the four photoelectric conversion elements PD2_1 to PD2_4 and the four charge transfer transistors TT2_1 to TT2_4 are formed in the second pixel 113.

The charge transfer transistors TT1_1 to TT1_4 of the first pixel 112 respectively include the vertical transfer gates G1_1 to G1_4 formed in different sub-pixel regions. The charge transfer transistors TT2_1 to TT2_4 of the second pixel 113 respectively include the vertical transfer gates G2_1 to G2_4 formed in different sub-pixel regions.

The four charge transfer transistors TT1_1 to TT1_4 are formed to share the first floating diffusion region FD1a in structure, and the four charge transfer transistors TT2_1 to TT2_4 are formed to share the fourth floating diffusion region FD2a in structure.

The four sub-pixel regions included in the first pixel 112 and the four sub-pixel regions included in the second pixel 113 are separated from each other by the FDTI. According to embodiments, a second negative voltage (e.g., −1.5 V) may be supplied to the FDTI formed between the sub-pixel regions.

For example, the FDTI may be filled with an insulating material (e.g., silicon dioxide (SiO2) or any other dielectric material), and thus, the FDTI may electrically isolate the sub-pixel regions from each other.

The first electrodes of the four charge transfer transistors TT1_1 to TT1_4 are connected with the first floating diffusion node ND1_1 through a first transfer line FL1, the second electrodes of the four charge transfer transistors TT1_1 to TT1_4 are respectively connected with the first terminals of the four photoelectric conversion elements PD1_1 to PD1_4, and the second terminals of the four photoelectric conversion elements PD1_1 to PD1_4 are connected with the negative voltage supply line NN. For example, when each of the photoelectric conversion elements is a photodiode, the first terminal may be a cathode, and the second terminal may be an anode.

In FIG. 4A, the first electrode of a dummy transistor DTr is connected with the negative voltage supply line NN, and the second electrode thereof is connected with the corresponding voltage node NP1 or NP2. According to an embodiment, a body voltage that is supplied to the body of the dummy transistor DTr is supplied to a gate DG of the dummy transistor DTr.

Referring to FIG. 4A, in the first pixel 112, the transistors TR1_1 and TR1_2 that respectively include the gates G11 and G12 are formed in the same sub-pixel region. As described with reference to FIG. 3A, the transistors TR1_1 and TR1_2 are separated from each other by the STI.

Also, in the second pixel 113, the transistors TR2_1 and TR2_2 that respectively include the gates G21 and G22 are formed in the same sub-pixel region. As described with reference to FIG. 3A, the transistors TR2_1 and TR2_2 are separated from each other by the STI.

Referring to FIGS. 3A and 4A, when a plurality of transistors are formed in one sub-pixel region, the plurality of transistors are separated from each other by the STI.

Referring to FIGS. 2 and 4A, the first connection line ML1 electrically connects the first connection node ND1_2 with the third connection node ND2_2, and the second connection line ML2 electrically connects the second connection node ND1_3 with the fourth connection node ND2_3.

Figure 4B:
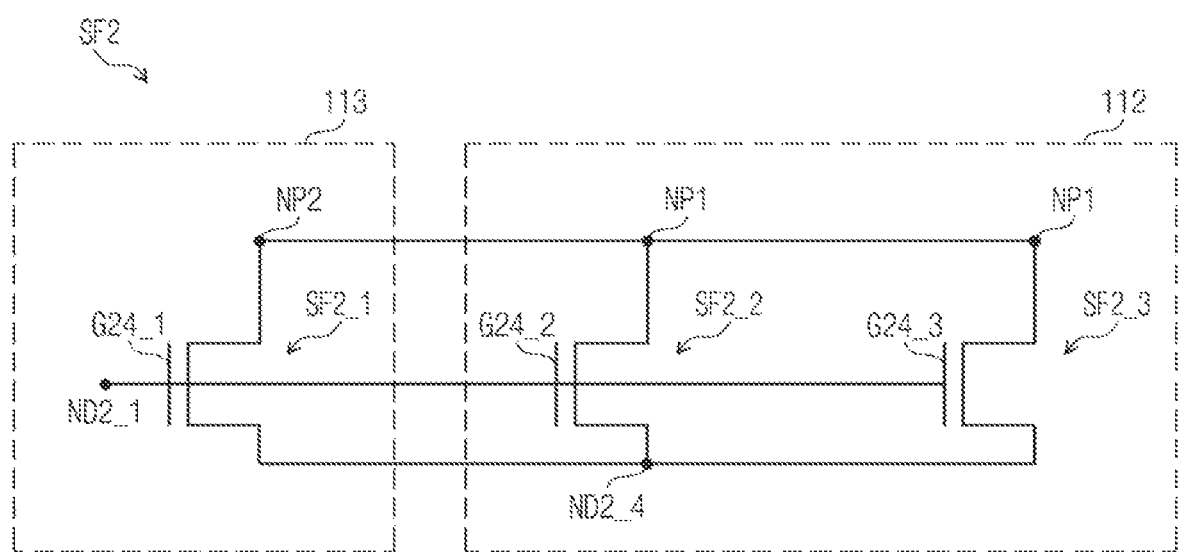
FIG. 4B is a circuit diagram illustrating an embodiment of a second source follower transistor included in a second pixel of FIG. 2.

FIG. 4B is a circuit diagram illustrating an embodiment of a second source follower transistor included in a second pixel of FIG. 2. Because the structure of the first source follower transistor SF1 is identical to the structure of the second source follower transistor SF2, the second source follower transistor SF2 including three sub-source follower transistors SF2_1, SF2_2, and SF2_3 connected in parallel are illustrated as an example, which will be described below.

One sub-source follower transistor SF2_1 of the three sub-source follower transistors SF2_1, SF2_2, and SF2_3 is formed in the second pixel 113, and the remaining sub-source follower transistors SF2_2 and SF2_3 are formed in the first pixel 112. Gates G24_1, G24_2, and G24_3 of the sub-source follower transistors SF2_1, SF2_2, and SF2_3 included in the second source follower transistor SF2 are connected with a second transfer line FL2 through metal contacts.

One of three sub-source follower transistors of the first pixel 112 is formed in the first pixel 112, and the remaining sub-source follower transistors are formed in a pixel (e.g., 111) immediately adjacent to the first pixel 112. Gates of the sub-source follower transistors included in the first source follower transistor SF1 are connected with the first transfer line FL1 through metal contacts.

One of three sub-source follower transistors included in a source follower transistor of a pixel adjacent to the second pixel 113 is formed in the pixel, and the remaining sub-source follower transistors are formed in the second pixel 113. Gates of the three sub-source follower transistors of the source follower transistor included in the pixel adjacent to the second pixel 113 are connected with a third transfer line FL3 through metal contacts.

The gates SF2_1, SF2_2, and SF2_3 of the sub-source follower transistors of FIG. 4B are connected with the fourth floating diffusion node ND2_1 through a metal contact and the second transfer line FL2.

The first electrode of the sub-source follower transistor SF2_1 implemented in the second pixel 113 from among the sub-source follower transistors SF2_1, SF2_2, and SF2_3 is connected with the sixth connection node ND2_4, and the second electrode thereof is connected with the second voltage node NP2.

However, the first electrode of each of the sub-source follower transistors SF2_2 and SF2_3 implemented in the first pixel 112 from among the sub-source follower transistors SF2_1, SF2_2, and SF2_3 is connected with the sixth connection node ND2_4, and the second electrode thereof is connected with the first voltage node NP1.

As illustrated in FIG. 4B, the sub-source follower transistor SF2_1 having the gate G24_1 is formed in the second pixel 113, and the sub-source follower transistor SF2_2 having the gate G24_2 and the sub-source follower transistor SF2_3 having the gate G24_3 are formed in the first pixel 112. In this case, the sub-source follower transistors SF2_2 and SF2_3 formed in the first pixel 112 are separated by the STI.

FIG. 5A is a plan view of a first pixel and a second pixel, each of which includes eight photoelectric conversion elements. The first pixel 112 includes eight sub-pixel regions, and the second pixel 113 includes eight sub-pixel regions.

Referring to FIGS. 1, 2, 3A, 3B and 5A, depending on the FDTI process, the eight photoelectric conversion elements PD1_1 to PD1_8 and the eight charge transfer transistors TT1_1 to TT1_8 are formed in the first pixel 112, and the eight photoelectric conversion elements PD2_1 to PD2_8 and the eight charge transfer transistors TT2_1 to TT2_8 are formed in the second pixel 113.

The charge transfer transistors TT1_1 to TT1_8 of the first pixel 112 respectively include the vertical transfer gates G1_1 to G1_8 formed in different sub-pixel regions; the charge transfer transistors TT2_1 to TT2_8 of the second pixel 113 respectively include the vertical transfer gates G2_1 to G2_8 formed in different sub-pixel regions.

The eight sub-pixel regions included in the first pixel 112 and the eight sub-pixel regions included in the second pixel 113 are separated from each other by the FDTI.

The first electrode of each of the eight charge transfer transistors TT1_1 to TT1_8 is connected with the first floating diffusion node ND1_1 through the first transfer line FL1, and the second electrode thereof is connected with the first terminal of each of the eight photoelectric conversion elements PD1_1 to PD1_8. The second terminals of the eight photoelectric conversion elements PD1_1 to PD1_8 are connected with the negative voltage supply line NN.

In FIG. 5A, the first electrode of the dummy transistor DTr is connected with the negative voltage supply line NN, and the second electrode thereof is connected with the corresponding voltage node NP1 or NP2. According to an embodiment, a body voltage that is supplied to the body of the dummy transistor DTr is supplied to the gate DG of the dummy transistor DTr.

Figure 5B:
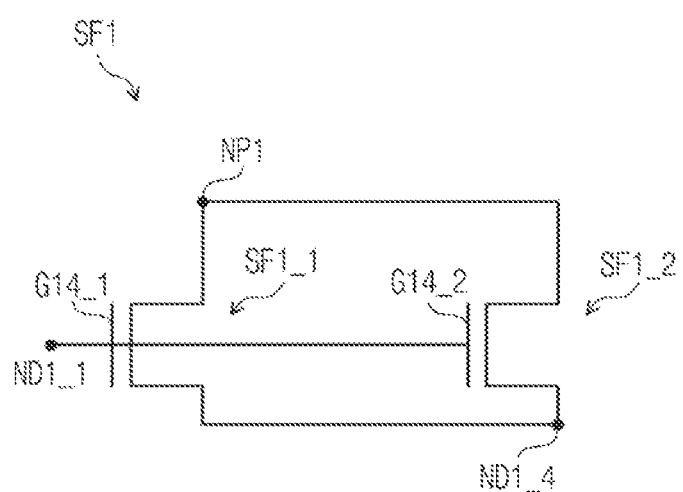
FIG. 5B is a circuit diagram illustrating an embodiment of a first source follower transistor included in a first pixel of FIG. 2.

FIG. 5B is a circuit diagram illustrating an embodiment of a first source follower transistor included in a first pixel of FIG. 2.

Because the structure of the first source follower transistor SF1 of the first pixel 112 is identical to the structure of the second source follower transistor SF2 of the second pixel 113, the structure of the first source follower transistor SF1 will be described with reference to FIG. 5B.

Referring to FIG. 5B, the first source follower transistor SF1 of the first pixel 112 includes two sub-source follower transistors SF1_1 and SF1_2 connected in parallel.

The two sub-source follower transistors SF1_1 and SF1_2 are formed in different sub-pixel regions.

Referring to FIGS. 2 and 5A, the first connection line ML1 electrically connects the first connection node ND1_2 connected with the second floating diffusion region FD1b and the third connection node ND2_2 connected with the fifth floating diffusion region FD2b, and the second connection line ML2 electrically connects the second connection node ND1_3 connected with the third floating diffusion region FD1c and the fourth connection node ND2_3 connected with the sixth floating diffusion region FD2c.

FIG. 6A is a plan view of a first pixel and a second pixel, each of which includes 16 photoelectric conversion elements.

Referring to FIGS. 1 to 3B and 6A, depending on the FDTI process, the 16 photoelectric conversion elements PD1_1 to PD1_16 and the 16 charge transfer transistors TT1_1 to TT1_16 are formed in the first pixel 112, and the 16 photoelectric conversion elements PD2_1 to PD2_16 and the 16 charge transfer transistors TT2_1 to TT2_16 are formed in the second pixel 113.

The charge transfer transistors TT1_1 to TT1_16 of the first pixel 112 respectively include the vertical transfer gates G1_1 to G1_16 formed in different sub-pixel regions; the charge transfer transistors TT2_1 to TT2_16 of the second pixel 113 respectively include the vertical transfer gates G2_1 to G2_16 formed in different sub-pixel regions.

The 16 sub-pixel regions included in the first pixel 112 and the 16 sub-pixel regions included in the second pixel 113 are separated from each other by the FDTI.

The first electrode of each of the 16 charge transfer transistors TT1_1 to TT1_16 is connected with the first floating diffusion node ND1_1 through the first transfer line FL1, and the second electrode thereof is connected with the first terminal of each of the 16 photoelectric conversion elements PD1_1 to PD1_16. The second terminals of the 16 photoelectric conversion elements PD1_1 to PD1_16 are connected with the negative voltage supply line NN.

Figure 6B:
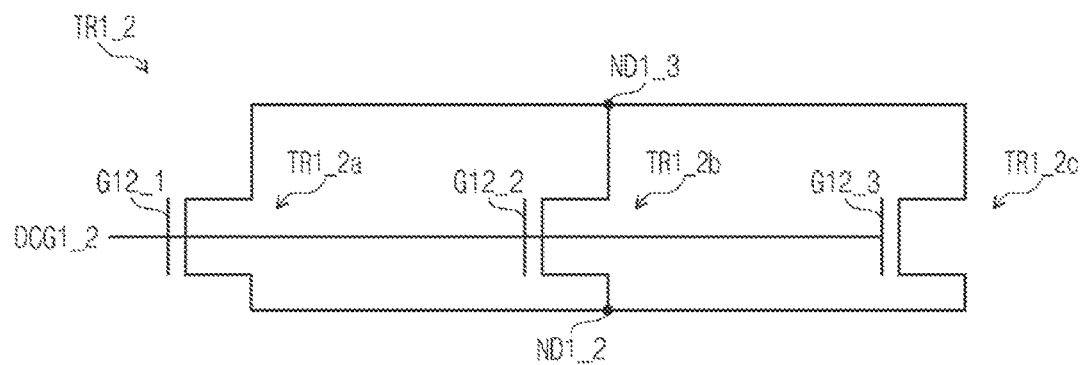
FIG. 6B is a circuit diagram illustrating an embodiment of a second transistor included in a first pixel of FIG. 2.
Figure 6C:
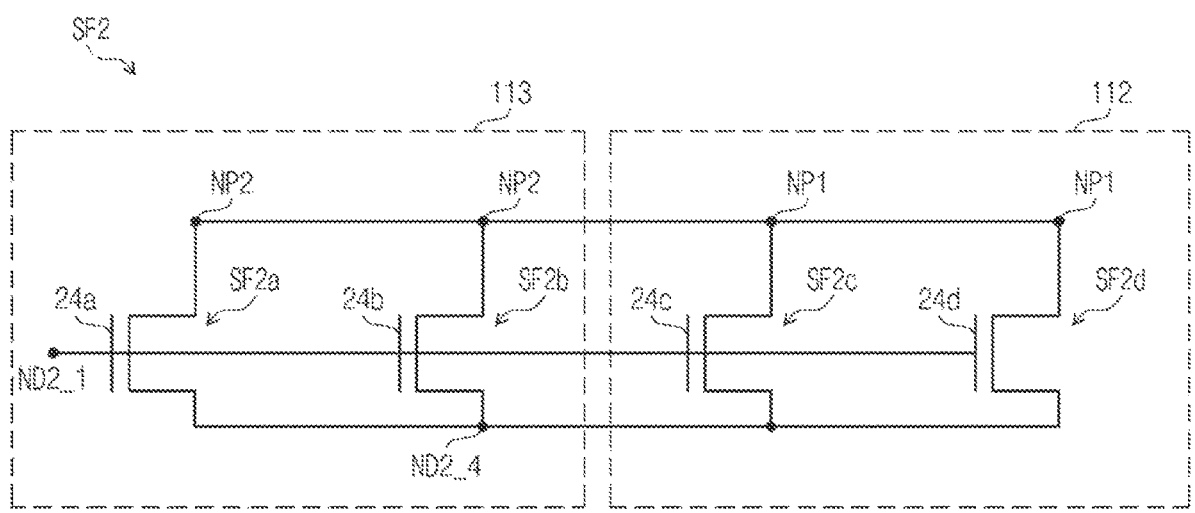
FIG. 6C is a circuit diagram illustrating an embodiment of a second source follower transistor included in a second pixel of FIG. 2.

FIG. 6B is a circuit diagram illustrating an embodiment of a second transistor included in a first pixel of FIG. 2, and FIG. 6C is a circuit diagram illustrating an embodiment of a second source follower transistor included in a second pixel of FIG. 2.

Referring to FIGS. 2, 6A, 6B, and 6C, because the second transistor TR1_2 and the fourth transistor TR2_2 have the same structure, the circuit diagram of the second transistor TR1_2 including three sub-transistors TR1_2a, TR1_2b, and TR1_2c connected in parallel is illustrated in FIG. 6B as an example. The three sub-transistors TR1_2a, TR1_2b, and TR1_2c are formed in different sub-pixel regions.

Because the first source follower transistor SF1 and the second source follower transistor SF2 have the same structure, the circuit diagram of the second source follower transistor SF2 including four sub-transistors SF2a, SF2b, SF2c, and SF2d connected in parallel is illustrated in FIG. 6C as an example.

Referring to FIG. 6A, the first source follower transistor SF1 include four sub-transistors connected in parallel; two of the four sub-transistors are formed in the first pixel 112, and the remaining sub-transistors are formed in a pixel (e.g., 111) immediately adjacent to the first pixel 112.

Referring to FIG. 6C, the second source follower transistor SF2 includes the four sub-transistors SF2a, SF2b, SF2c, and SF2d connected in parallel; two sub-transistors SF2a and SF2b of the four sub-transistors SF2a, SF2b, SF2c, and SF2d are formed in the second pixel 113, and the remaining sub-transistors SF2c and SF2d are formed in the first pixel 112. The sub-transistors SF2a, SF2b, SF2c, and SF2d include gates 24a, 24b, 24c, and 24d, respectively.

Figure 7:
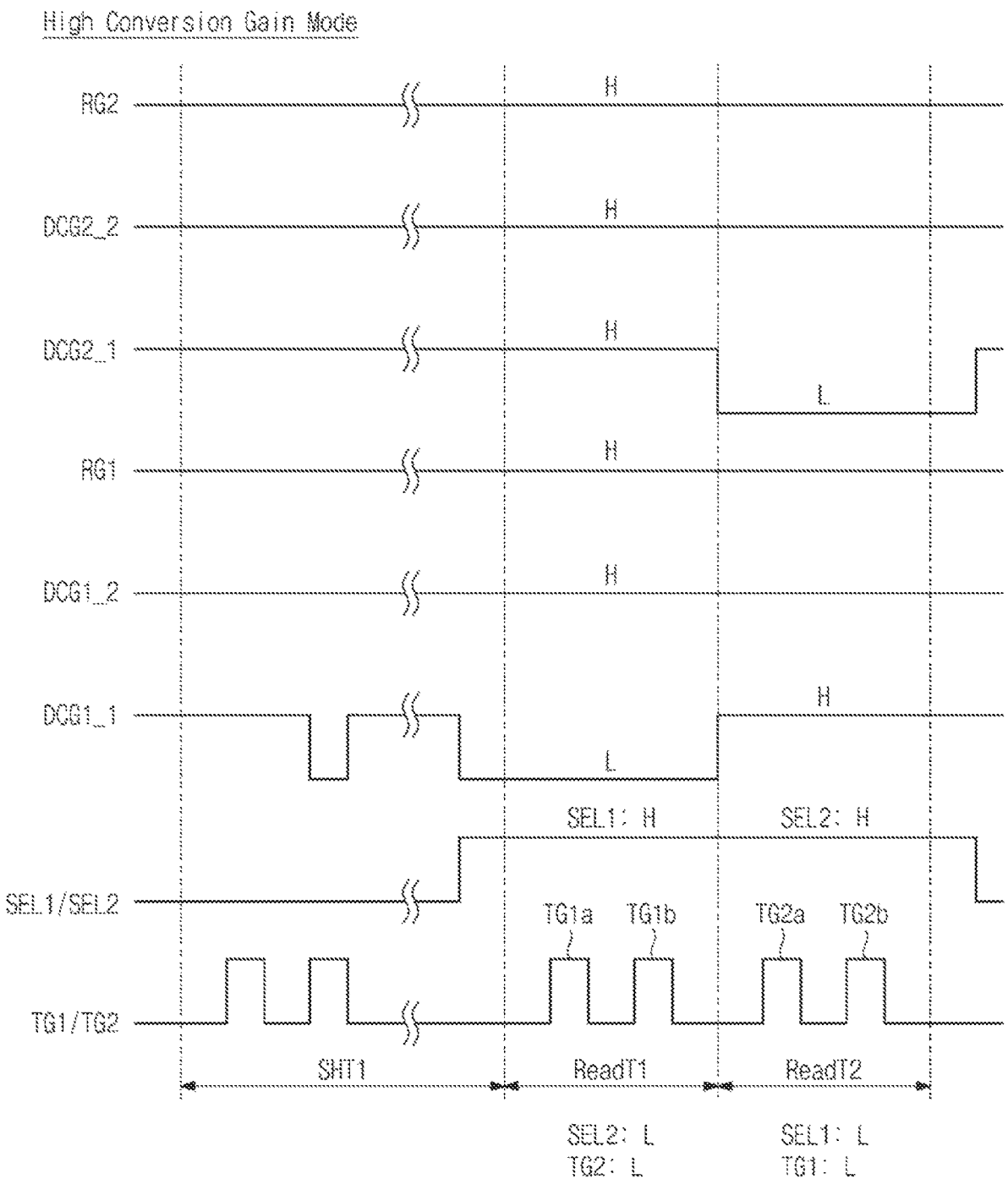
FIG. 7 is a timing diagram of control signals supplied to a first pixel and a second pixel of FIG. 2 when an image sensor of FIG. 1 operates in a high conversion gain mode.

FIG. 7 is a timing diagram of control signals supplied to a first pixel and a second pixel of FIG. 2 when an image sensor of FIG. 1 operates in a high conversion gain mode.

Referring to FIGS. 1 to 7, when the image sensor 100 operates in a first conversion gain mode (e.g., a high conversion gain (HCG) mode), depending on the mode control signal MODE_ctl indicating that the image sensor 100 operates in the high conversion gain mode, the control signal generator 150 generates the control signals TG1, SEL1, RG1, DCG1_1, DCG1_2, RG2, DCG2_1, and DCG2_2 having waveforms illustrated in FIG. 7 and supplies the control signals TG1, SEL1, RG1, DCG1_1, DCG1_2, RG2, DCG2_1, and DCG2_2 to the first pixel 112 and the second pixel 113.

Herein, it is assumed that the first charge transfer control signal TG1 collectively calls the first group of charge transfer control signals TG1_1 to TG1_$k$ supplied to the gates G1_1 to G1_$k$ of the charge transfer transistors TT1_1 to TT1_$k$ and a waveform of each of the first group of charge transfer control signals TG1_1 to TG1_$k$ is identical to the waveform of the first charge transfer control signal TG1.

It is assumed that the second charge transfer control signal TG2 collectively calls the second group of charge transfer control signals TG2_1 to TG2_$k$ supplied to the gates G2_1 to G2_$k$ of the charge transfer transistors TT2_1 to TT2_$k$ and a waveform of each of the second group of charge transfer control signals TG2_1 to TG2_$k$ is identical to the waveform of the second charge transfer control signal TG2.

The first reset signal RG1 is supplied to the gate G13 of the first reset transistor RT1, the first conversion gain control signal DCG1_1 is supplied to the gate G11 of the first control transistor TR1_1, the second conversion gain control signal DCG1_2 is supplied to the gate G12 of the second control transistor TR1_2, and the first selection signal SEL1 is supplied to the gate G15 of the first select transistor ST1.

The second reset signal RG2 is supplied to the gate G23 of the second reset transistor RT2, the third conversion gain control signal DCG2_1 is supplied to the gate G21 of the third control transistor TR2_1, the fourth conversion gain control signal DCG2_2 is supplied to the gate G22 of the fourth control transistor TR2_2, and the second selection signal SEL2 is supplied to the gate G24 of the second select transistor ST2.

In this case, each of the transistors TT1_1 to TT1_$k$, ST1, SF1, TR1_1, TR1_2, RT1, TT2_1 to TT2_$k$, ST2, SF2, TR2_1, TR2_2, and RT2 is an n-type MOS transistor.

Figure 8:
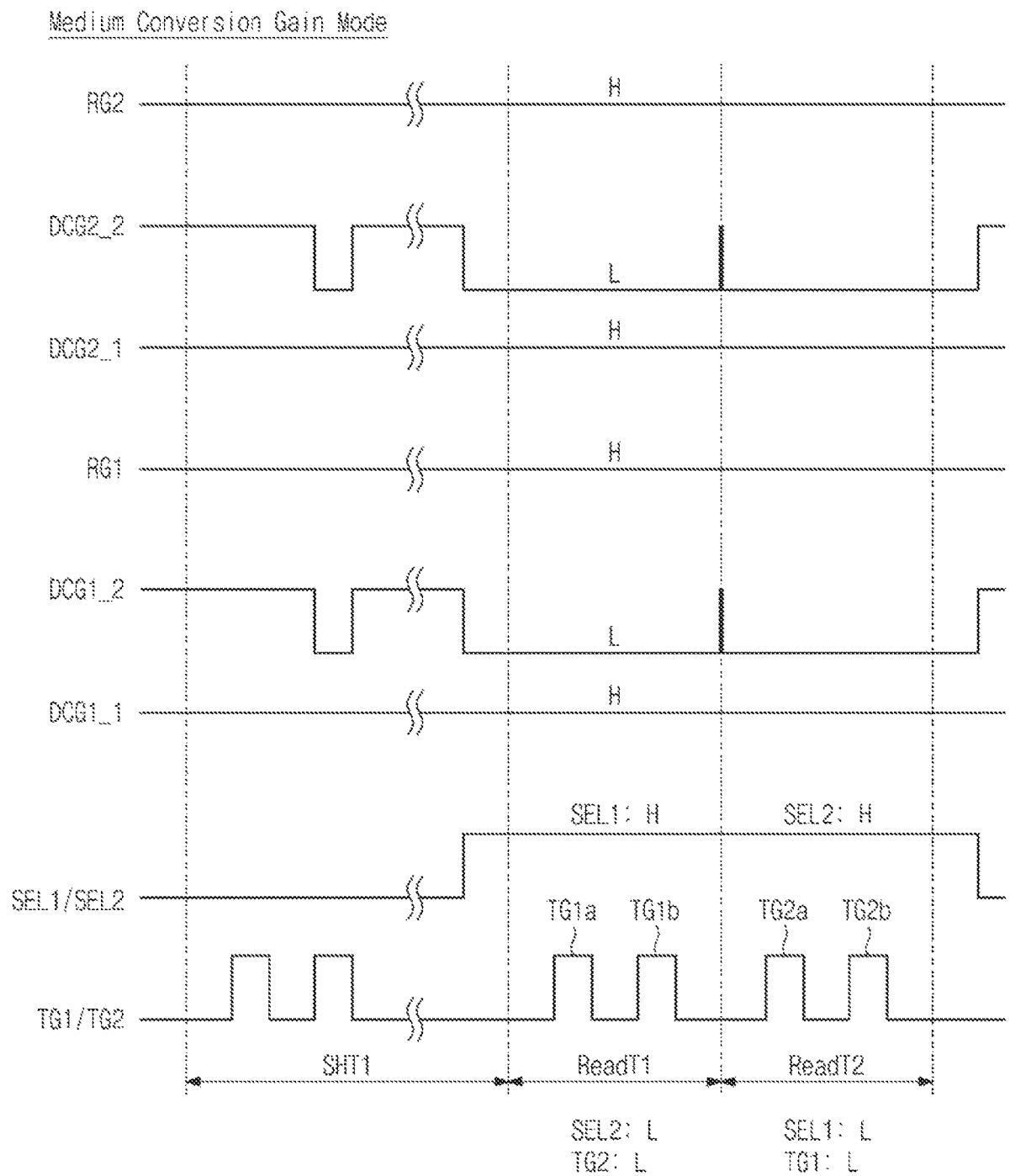
FIG. 8 is a timing diagram of control signals supplied to a first pixel and a second pixel of FIG. 2 when an image sensor of FIG. 1 operates in a medium conversion mode.
Figure 9:
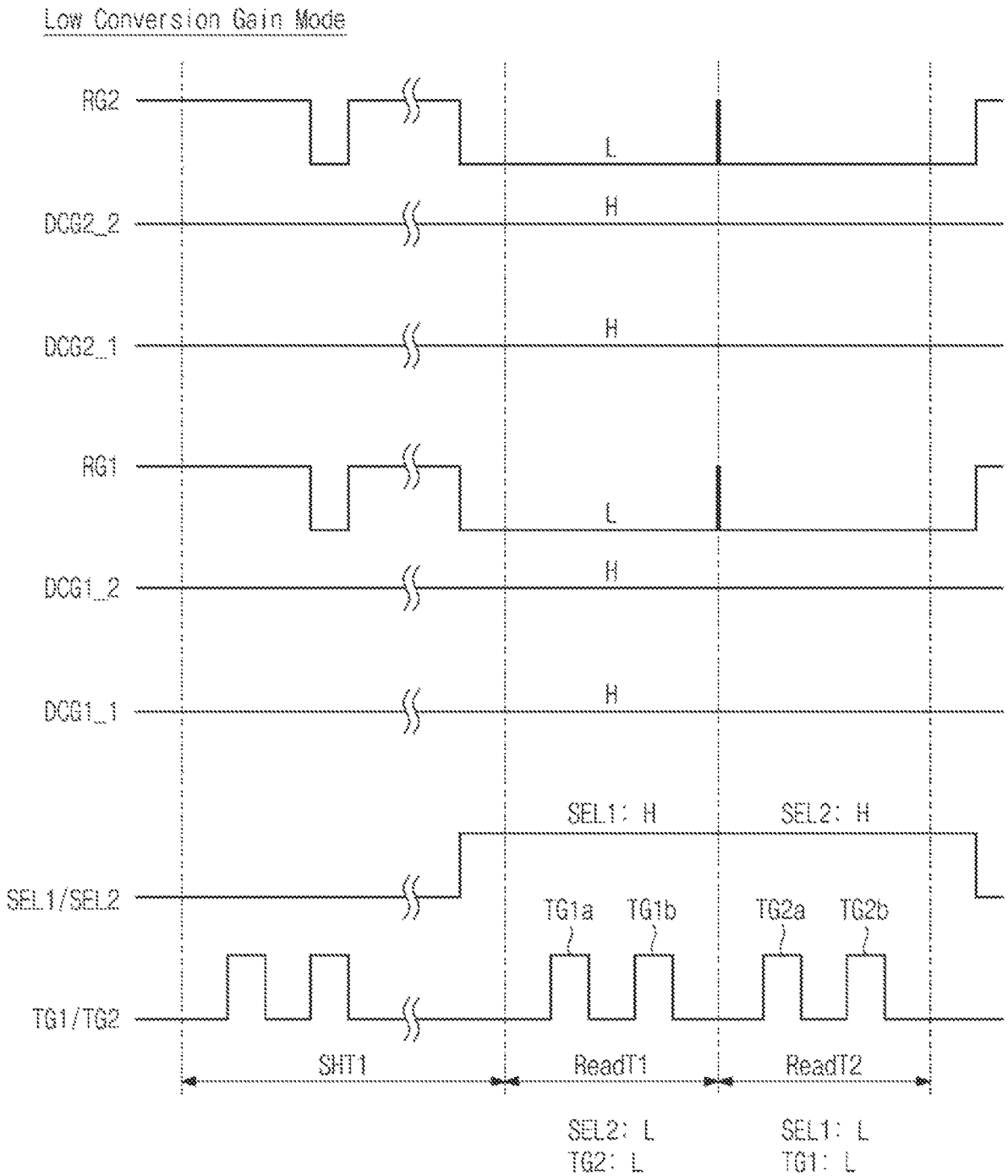
FIG. 9 is the timing diagram of control signals supplied to a first pixel and a second pixel of FIG. 2 when an image sensor of FIG. 1 operates in a low conversion gain mode.

In FIGS. 7 to 9, "H" means the high level for turning on the n-type MOS transistor, and "L" means the low level for turning off the n-type MOS transistor.

To perform the high conversion gain (HCG) mode, the control signal generator 150 generates the first charge transfer control signal TG1 that toggles twice during a shutter time period SHT1.

During a first readout time period ReadT1 in which the first pixel signal PIX1 output from the first pixel 112 is read out, the control signal generator 150 generates the first charge transfer control signal TG1 including a first pulse signal TG1$a$ and a second pulse signal TG1$b$.

During a second readout time period ReadT2 in which the first pixel signal PIX1 output from the second pixel 113 is read out, the control signal generator 150 generates the second charge transfer control signal TG2 including a third pulse signal TG2$a$ and a fourth pulse signal TG2$b$.

According to embodiments, during the first readout time period ReadT1, only two charge transfer transistors TT1_1 and TT1_2 or TT1_1 and TT1_3 among the four charge transfer transistors TT1_1 to TT1_4 included in the first pixel 112 illustrated in FIGS. 2 and 4A may be turned on in response to the first pulse signal TG1$a$ having the high level, and only two charge transfer transistors TT1_3 and TT1_4 or TT1_2 and TT1_4 among the four charge transfer transistors TT1_1 to TT1_4 may be turned on in response to the second pulse signal TG1$b$ having the high level.

Also, during the second readout time period ReadT2, only two charge transfer transistors TT2_1 and TT2_2 or TT2_1 and TT2_3 among the four charge transfer transistors TT2_1 to TT2_4 included in the second pixel 113 illustrated in FIGS. 2 and 4A may be turned on in response to the third pulse signal TG2$a$ having the high level, and only two charge transfer transistors TT2_3 and TT2_4 or TT2_2 and TT2_4 among the four charge transfer transistors TT2_1 to TT2_4 may be turned on in response to the fourth pulse signal TG2$b$ having the high level.

According to embodiments, during the first readout time period ReadT1, only four charge transfer transistors TT1_1, TT1_2, TT1_5, and TT1_6 or TT1_1, TT1_3, TT1_5, and TT1_7 among the eight charge transfer transistors TT1_1 to TT1_8 included in the first pixel 112 illustrated in FIGS. 2 and 5A may be turned on in response to the first pulse signal TG1$a$ having the high level, and only four charge transfer transistors TT1_3, TT1_4, TT1_7, and TT1_8 or TT1_2, TT1_4, TT1_6, and TT1_8 among the eight charge transfer transistors TT1_1 to TT1_8 may be turned on in response to the second pulse signal TG1$b$ having the high level.

Also, during the second readout time period ReadT2, only four charge transfer transistors TT2_1, TT2_2, TT2_5, and TT2_6 or TT2_1, TT2_3, TT2_5, and TT2_7 among the eight charge transfer transistors TT1_1 to TT1_8 included in the second pixel 113 illustrated in FIGS. 2 and 5A may be turned on in response to the third pulse signal TG2$a$ having the high level, and only four charge transfer transistors TT2_3, TT2_4, TT2_7, and TT2_8 or TT2_2, TT2_4, TT2_6, and TT2_8 among the eight charge transfer transistors TT2_1 to TT2_8 may be turned on in response to the fourth pulse signal TG2$b$ having the high level.

According to embodiments, during the first readout time period ReadT1, only eight charge transfer transistors TT1_1, TT1_2, TT1_5, TT1_6, TT1_9, TT1_10, TT1_13, and TT1_14 or TT1_1, TT1_3, TT1_5, TT1_7, TT1_9, TT1_11, TT1_13, and TT1_15 among the 16 charge transfer transistors TT1_1 to TT1_16 included in the first pixel 112 illustrated in FIGS. 2 and 6A may be turned on in response to the first pulse signal TG1$a$ having the high level, and only eight charge transfer transistors TT1_3, TT1_4, TT1_7, TT1_8, TT1_11, TT1_12, TT1_15, and TT1_16 or TT1_2, TT1_4, TT1_6, TT1_8, TT1_10, TT1_12, TT1_14, and TT1_16 among the 16 charge transfer transistors TT1_1 to TT1_16 may be turned on in response to the second pulse signal TG1$b$ having the high level.

Also, during the second readout time period ReadT2, only eight charge transfer transistors TT2_1, TT2_2, TT2_5, TT2_6, TT2_9, TT2_10, TT2_13, and TT2_14 or TT2_1, TT2_3, TT2_5, TT2_7, TT2_9, TT2_11, TT2_13, and TT2_15 among the 16 charge transfer transistors TT2_1 to TT2_16 included in the first pixel 112 illustrated in FIGS. 2 and 6A may be turned on in response to the third pulse signal TG2$a$ having the high level, and only eight charge transfer transistors TT2_3, TT2_4, TT2_7, TT2_8, TT2_11, TT2_12, TT2_15, and TT2_16 or TT2_2, TT2_4, TT2_6, TT2_8, TT2_10, TT2_12, TT2_14, and TT2_16 among the 16 charge transfer transistors TT2_1 to TT2_16 may be turned on in response to the fourth pulse signal TG2$b$ having the high level.

During the first readout time period ReadT1 of FIG. 7, the transistors ST1, TR1_2, RT1, TR2_1, TR2_2, and RT2 are turned on depending on the control signals SEL1, DCG1_2, RG1, DCG2_1, DCG2_2, and RG2 having the high level "H", and the transistors TT2_1 to TT2_k, ST2, and TR1_1 are turned off depending on the control signals TG2, SEL2, and DCG1_1 having the low level "L".

For example, for an auto-focus operation, the first charge transfer control signal TG1 including the first pulse signal TG1a and the second pulse signal TG1b is generated, and the second charge transfer control signal TG2 including the third pulse signal TG2a and the fourth pulse signal TG2b is generated.

During the second readout time period ReadT2 of FIG. 7, the transistors ST2, TR1_1, TR1_2, RT1, TR2_2, and RT2 are turned on depending on the control signals SEL2, DCG1_1, DCG1_2, RG1, DCG2_2, and RG2 having the high level "H", and the transistors TT1_1 to TT1_k, ST1, and TR2_1 are turned off depending on the control signals TG1, SEL1, and DCG2_1 having the low level "L".

The second readout operation that is performed in the second readout time period ReadT2 starts immediately after the first readout operation that is performed in the first readout time period ReadT1.

FIG. 8 is a timing diagram of control signals supplied to a first pixel and a second pixel of FIG. 2 when an image sensor of FIG. 1 operates in a medium conversion mode.

Referring to FIGS. 1 to 6C and 8, when the image sensor 100 operates in a second conversion gain mode (e.g., a medium conversion gain (MCG) mode), depending on the mode control signal MODE_ctl indicating that the image sensor 100 operates in the medium conversion gain mode, the control signal generator 150 generates the control signals TG1, SEL1, DCG1_1, DCG1_2, RG1, DCG2_1, DCG2_2, and RG2 having waveforms illustrated in FIG. 8 and supplies the control signals TG1, SEL1, DCG1_1, DCG1_2, RG1, DCG2_1, DCG2_2, and RG2 to the first pixel 112 and the second pixel 113.

During the first readout time period ReadT1 of FIG. 8, the transistors ST1, TR1_1, RT1, TR2_1, and RT2 are turned on depending on the control signals SEL1, DCG1_1, RG1, DCG2_1, and RG2 having the high level "H", and the transistors ST2, TT2_1 to TT2_k, TR1_2, and TR2_2 are turned off depending on the control signals SEL2, TG2, DCG1_2, and DCG2_2 having the low level "L".

During the second readout time period ReadT2 of FIG. 8, the transistors ST2, TR1_1, RT1, TR2_1, and RT2 are turned on depending on the control signals SEL2, DCG1_1, RG1, DCG2_1, and RG2 having the high level "H", and the transistors ST1, TT1_1 to TT1_k, TR1_2, and TR2_2 are turned off depending on the control signals SEL1, TG1, DCG1_2, and DCG2_2 having the low level "L".

As illustrated in FIG. 8, each of the conversion gain control signals DCG1_1 and DCG2_1 shortly toggles once between the first readout time period ReadT1 and the second readout time period ReadT2 such that the first readout time period ReadT1 and the second readout time period ReadT2 are distinguished from each other.

FIG. 9 is the timing diagram of control signals supplied to a first pixel and a second pixel of FIG. 2 when an image sensor of FIG. 1 operates in a low conversion gain mode.

Referring to FIGS. 1 to 6C and 9, when the image sensor 100 operates in a third conversion gain mode (e.g., a low conversion gain (LCG) mode), depending on the mode control signal MODE_ctl indicating that the image sensor 100 operates in the low conversion gain mode, the control signal generator 150 generates the control signals TG1, SEL1, TG2, SEL2, DCG1_1, DCG1_2, RG1, DCG2_1, DCG2_2, and RG2 having waveforms illustrated in FIG. 9 and supplies the control signals TG1, SEL1, TG2, SEL2, DCG1_1, DCG1_2, RG1, DCG2_1, DCG2_2, and RG2 to the first pixel 112 and the second pixel 113.

During the first readout time period ReadT1 of FIG. 9, the transistors ST1, TR1_1, TR1_2, TR2_1, and TR2_2 are turned on depending on the control signals SEL1, DCG1_1, DCG1_2, DCG2_1, and DCG2_2 having the high level "H", and the transistors ST2, TT2_1 to TT2_k, RT1, and RT2 are turned off depending on the control signals SEL2, TG2, RG1, and RG2 having the low level "L".

During the second readout time period ReadT2 of FIG. 9, the transistors ST2, TR1_1, TR1_2, TR2_1, and TR2_2 are turned on depending on the control signals SEL2, DCG1_1, DCG1_2, DCG2_1, and DCG2_2 having the high level "H", and the transistors ST1, TT1_1 to TT1_k, RT1, and RT2 are turned off depending on the control signals SEL1, TG1, RG1, and RG2 having the low level "L".

As illustrated in FIG. 9, each of the reset signals RG1 and RG2 shortly toggles once between the first readout time period ReadT1 and the second readout time period ReadT2 such that the first readout time period ReadT1 and the second readout time period ReadT2 are distinguished from each other.

According to embodiments, under the assumption that the number of photoelectric conversion elements PD1_1 to PD1_k/PD2_1 to PD2_k included in each of the pixels 112 and 113 is 4 (i.e., when k=4), when a conversion gain of the low conversion gain mode is defined as LCG (or a third value), a conversion gain of the medium conversion gain mode is defined as MCG (or a second value), and a conversion gain of the high conversion gain mode is defined as HCG (or a first value), the HCG is greater than the MCG, and the MCG is greater than the LCG.

According to an embodiment, a ratio of MCG to LCG may be 2 (=MCG/LCG), and a ratio of HCG to LCG may be 4 (=HCG/LCG).

According to embodiments, when the number of photoelectric conversion elements PD1_1 to PD1_k/PD2_1 to PD2_k included in each of the pixels 112 and 113 is 8 (i.e., when k=8), the HCG is greater than the MCG, and the MCG is greater than the LCG.

According to an embodiment, a ratio of MCG to LCG may be 2 (=MCG/LCG), and a ratio of HCG to LCG may be 8 (=HCG/LCG). Alternatively, a ratio of MCG to LCG may be 4 (=MCG/LCG), and a ratio of HCG to LCG may be 8 (=HCG/LCG).

According to embodiments, when the number of photoelectric conversion elements PD1_1 to PD1_k/PD2_1 to PD2_k included in each of the pixels 112 and 113 is 16 (i.e., when k=16), the HCG is greater than the MCG, and the MCG is greater than the LCG.

According to an embodiment, in each of the source follower transistors SF1 and SF2, when the LCG is 7.5 μN/e−, the MCG is 30 μN/e−, and the HCG is 120 μN/e−, a ratio of MCG to LCG may be 4 (=MCG/LCG), and a ratio of HCG to LCG may be 16 (=HCG/LCG).

Figure 10:
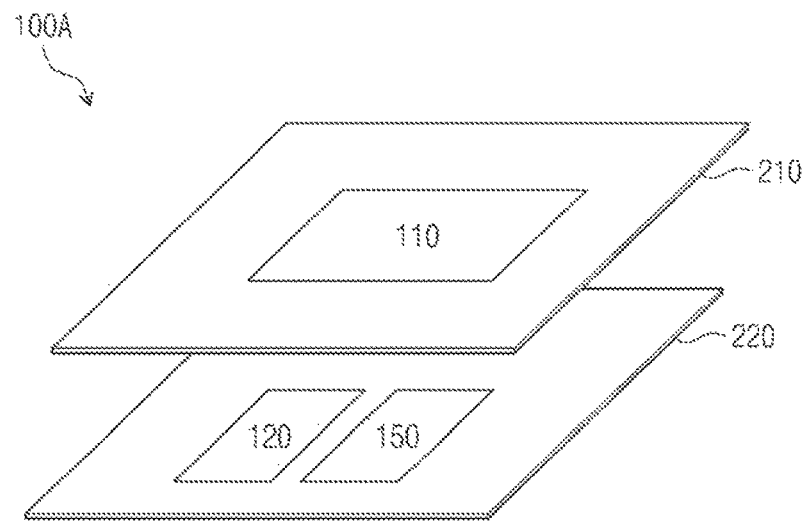
FIG. 10 is a block diagram illustrating an implementation example of an image sensor illustrated in FIG. 1.

FIG. 10 is a block diagram illustrating an implementation example of an image sensor illustrated in FIG. 1.

Referring to FIGS. 1 and 10, an image sensor 100A includes a first semiconductor chip 210 and a second semiconductor chip 220. The pixel array 110 may be integrated in the first semiconductor chip 210, and the readout circuit 120 and the control signal generator 150 may be integrated in the second semiconductor chip 220. According to embodiments, the image sensor 110 may be integrated in one semiconductor chip.

Figure 11:
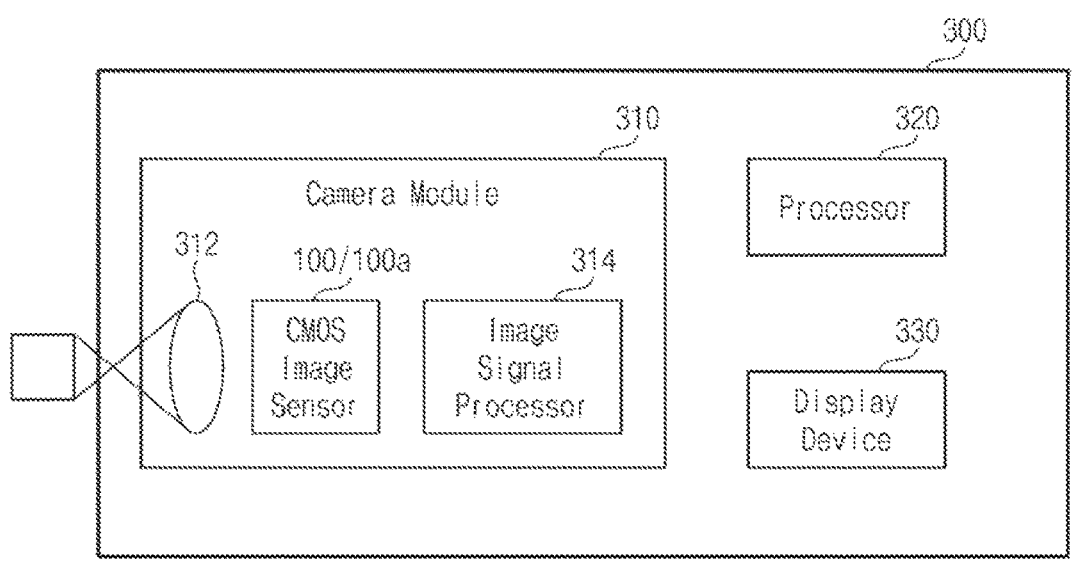
FIG. 11 is a block diagram of an image processing device including an image sensor illustrated in FIG. 1.

FIG. 11 is a block diagram of an image processing device including an image sensor illustrated in FIG. 1. Referring to FIG. 11, an image processing device 300 that is also called an imaging device or an image processing system includes a camera module 310, a processor 320, and a display device 330.

The image processing device 300 may be used in a computer system, a mobile device, a CCTV system, a wearable computer, or an in-vehicle infotainment system. Examples of the mobile device include a smartphone, a laptop computer, a mobile internet device (MID), an internet of things (IoT) device, a drone, and the like.

The image sensor 100 or 100a of the camera module 310 photographs a subject by using a lens 312, generates an image signal corresponding to the photographed subject, and sends the image signal to an image signal processor 314. The image sensor 110 or 100a may be the image sensor 100A described with reference to FIG. 10.

Image data processed by the image signal processor 314 may be provided to the processor 320, and the processor 320 may display an image corresponding to the processed image data through the display device 330. The processor 320 may be a CPU or application processor, and the display device 330 may be a light-emitting diode (LED) display device, an organic light-emitting diode (OLED) display device, or an active matrix OLED display device (AMOLED) display device.

A dynamic range is defined by 20$log$ (saturation signal/dark signal). Each of the saturation signal and the dark signal may be a pixel signal output from the pixel "PIXEL" or the pixel array 110.

According to an embodiment of the present disclosure, an image sensor supporting a triple conversion gain may optimize a dynamic range, a signal-to-noise ratio (SNR), and a noise compared to a conventional image sensor.

While example embodiments of the present disclosure have been described, it will be apparent to those of ordinary skill in the art that various changes and modifications may be made thereto without departing from the spirit and scope of the present disclosure as set forth in the following claims.

What is claimed is:

1. A pixel array comprising:
pixels arranged in a matrix shape and separated from each other by front deep trench isolation (FDTI), each of the pixels having a same structure,
wherein a first pixel among the pixels comprises:
   a first floating diffusion region;
   a first group of photoelectric conversion elements that are separated from each other by the FDTI;
   a first group of charge transfer transistors respectively comprising vertical transfer gates, the first group of charge transfer transistors being configured to transfer photo-generated charges generated by the first group of photoelectric conversion elements to the first floating diffusion region;
   a first source follower transistor comprising a first gate connected with the first floating diffusion region; and
   a first transistor, a second transistor, and a first reset transistor connected in series, between the first floating diffusion region and a voltage supply line supplying a pixel power supply voltage, to adjust a first conversion gain of the first source follower transistor,
wherein a first one of the first transistor, the second transistor, and the first reset transistor is provided in a first sub-pixel region of the first pixel together with a first photoelectric conversion element among the first group of photoelectric conversion elements,
wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and
wherein the first sub-pixel region and the second sub-pixel region are separated from each other by the FDTI.

2. The pixel array of claim 1, wherein a third one of the first transistor, the second transistor, and the first reset transistor, other than the first one and the second one of the first transistor, the second transistor, and the first reset transistor, is provided in a third sub-pixel region of the first pixel together with a third photoelectric conversion element among the first group of photoelectric conversion elements, and
wherein the second sub-pixel region and the third sub-pixel region are separated from each other by the FDTI.

3. The pixel array of claim 1, wherein the first source follower transistor comprises sub-source follower transistors connected in parallel,
wherein gates of the sub-source follower transistors are connected with the first floating diffusion region,
wherein the sub-source follower transistors are provided in a plurality of sub-pixel regions of the first pixel, and
wherein the plurality of sub-pixel regions are separated from each other by the FDTI.

4. The pixel array of claim 1, wherein the second transistor comprises sub-transistors connected in parallel,
wherein the sub-transistors are respectively provided in a plurality of sub-pixel regions of the first pixel, and
wherein the plurality of sub-pixel regions are separated from each other by the FDTI.

5. The pixel array of claim 1, wherein a second pixel adjacent to the first pixel among the pixels comprises:
   a second floating diffusion region;
   a second group of photoelectric conversion elements separated from each other by the FDTI;
   a second group of charge transfer transistors respectively comprising vertical transfer gates, the second group of charge transfer transistors being configured to transfer photo-generated charges generated by the second group of photoelectric conversion elements to the second floating diffusion region;
   a second source follower transistor comprising a second gate connected with the second floating diffusion region; and
   a third transistor, a fourth transistor, and a second reset transistor connected in series between the second floating diffusion region and the voltage supply line, to adjust a second conversion gain of the second source follower transistor,
wherein a first one of the third transistor, the fourth transistor, and the second reset transistor is provided in a third sub-pixel region of the second pixel together with a third photoelectric conversion element among the second group of photoelectric conversion elements,
wherein a second one of the third transistor, the fourth transistor, and the second reset transistor, other than the first one of the third transistor, the fourth transistor, and the second reset transistor, is provided in a fourth sub-pixel region of the second pixel together with a fourth photoelectric conversion element among the second group of photoelectric conversion elements, and wherein the third sub-pixel region and the fourth sub-pixel region are separated by the FDTI.

6. The pixel array of claim 5, wherein a third one of the third transistor, the fourth transistor, and the second reset transistor, other than the first one and the second one of the third transistor, the fourth transistor, and the second reset transistor, is provided in a fifth sub-pixel region of the second pixel together with a third photoelectric conversion element among the second group of photoelectric conversion elements, and wherein the fourth sub-pixel region and the fifth sub-pixel region are separated by the FDTI.

7. The pixel array of claim 5, further comprising:
a first connection line connected between a first connection node between the first transistor and the second transistor and a third connection node between the third transistor and the fourth transistor; and
a second connection line connected between a second connection node between the second transistor and the first reset transistor and a fourth connection node between the fourth transistor and the second reset transistor.

8. The pixel array of claim 7, wherein, when only the first transistor among the first transistor, the second transistor, the first reset transistor, the third transistor, the fourth transistor, and the second reset transistor is turned off, the first conversion gain has a first value, and wherein, when only the second transistor and the fourth transistor among the first transistor, the second transistor, the first reset transistor, the third transistor, the fourth transistor, and the second reset transistor are turned off, the first conversion gain has a second value, and wherein the first value is greater than the second value.

9. The pixel array of claim 8, wherein, when only the first reset transistor and the second reset transistor among the first reset transistor, the second transistor, the first reset transistor, the third transistor, the fourth transistor, and the second reset transistor are turned off, the first conversion gain has a third value, and wherein the second value is greater than the third value.

10. The pixel array of claim 1, wherein, when each of the first group of photoelectric conversion elements is a photodiode, an anode of the photodiode is connected with a negative voltage supply line supplying a first negative voltage, and wherein a second negative voltage is supplied to the FDTI.

11. An image sensor comprising:
a pixel array comprising pixels arranged in a matrix shape and separated from each other front deep trench isolation (FDTI), each of the pixels having a same structure; and
an analog-to-digital converter configured to convert an analog pixel signal output from the pixel array into a digital signal, wherein a first pixel among the pixels comprises:
a first floating diffusion region;
a first group of photoelectric conversion elements that are separated from each other by the FDTI;
a first group of charge transfer transistors respectively comprising vertical transfer gates, the first group of charge transfer transistors being configured to transfer photo-generated charges generated by the first group of photoelectric conversion elements to the first floating diffusion region;
a first source follower transistor comprising a first gate connected with the first floating diffusion region; and
a first transistor, a second transistor, and a first reset transistor connected in series between the first floating diffusion region and a voltage supply line supplying a pixel power supply voltage, to adjust a first conversion gain of the first source follower transistor, wherein a first one of the first transistor, the second transistor, and the first reset transistor is provided in a first sub-pixel region of the first pixel together with a first photoelectric conversion element among the first group of photoelectric conversion elements, wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and wherein the first sub-pixel region and the second sub-pixel region are separated from each other by the FDTI.

12. The image sensor of claim 11, wherein a third one of the first transistor, the second transistor, and the first reset transistor, other than the first one and the second one of the first transistor, the second transistor, and the first reset transistor, is provided in a third sub-pixel region of the first pixel together with a third photoelectric conversion element among the first group of photoelectric conversion elements, and wherein the second sub-pixel region and the third sub-pixel region are separated from each other by the FDTI.

13. The image sensor of claim 11, wherein the first source follower transistor comprises sub-source follower transistors connected in parallel, wherein gates of the sub-source follower transistors are connected with the first floating diffusion region, wherein the sub-source follower transistors are respectively provided in a plurality of sub-pixel regions of the first pixel, and wherein the plurality of sub-pixel regions are separated from each other by the FDTI.

14. The image sensor of claim 11, wherein the second transistor comprises sub-transistors connected in parallel, wherein the sub-transistors are respectively formed in a plurality of sub-pixel regions of the first pixel, and wherein the plurality of sub-pixel regions are separated from each other by the FDTI.

15. The image sensor of claim 11, wherein a second pixel adjacent to the first pixel among the pixels comprises:
a second floating diffusion region;
a second group of photoelectric conversion elements separated from each other by the FDTI;
a second group of charge transfer transistors respectively comprising vertical transfer gates, the second group of charge transfer transistors being configured to transfer photo-generated charges generated by the second group of photoelectric conversion elements to the second floating diffusion region;
a second source follower transistor comprising a second gate connected with the second floating diffusion region; and
a third transistor, a fourth transistor, and a second reset transistor connected in series between the second floating diffusion region and the voltage supply line, to adjust that a second conversion gain of the second source follower transistor, wherein a first one of the third transistor, the fourth transistor, and the second reset transistor is provided in a third sub-pixel region of the second pixel together with a third photoelectric conversion element among the second group of photoelectric conversion elements, wherein a second one among the third transistor, the fourth transistor, and the second reset transistor, other than the first one of the third transistor, the fourth transistor, and the second reset transistor, is provided in a fourth sub-pixel region of the second pixel together with a fourth photoelectric conversion element among the second group of photoelectric conversion elements, and wherein the third sub-pixel region and the fourth sub-pixel region are separated by the FDTI.

16. The image sensor of claim 15, wherein the pixel array further comprises:
 a first connection line connected between a first connection node between the first transistor and the second transistor and a third connection node between the third transistor and the fourth transistor; and
 a second connection line connected between a second connection node between the second transistor and the first reset transistor and a fourth connection node between the fourth transistor and the second reset transistor.

17. An image processing device comprising:
 an image sensor; and
 a processor configured to control an operation of the image sensor,
 wherein the image sensor comprises:
 a pixel array comprising pixels arranged in a matrix shape and separated from each other front deep trench isolation (FDTI), each of the pixels having a same structure; and
 an analog-to-digital converter configured to convert an analog pixel signal output from the pixel array into a digital signal,
 wherein a first pixel among the pixels comprises:
 a first floating diffusion region;
 a first group of photoelectric conversion elements that are separated from each other by the FDTI;
 a first group of charge transfer transistors respectively comprising vertical transfer gates, the first group of charge transfer transistors being configured to transfer photo-generated charges generated by the first group of photoelectric conversion elements to the first floating diffusion region;
 a first source follower transistor comprising a first gate connected with the first floating diffusion region; and
 a first transistor, a second transistor, and a first reset transistor connected in series between the first floating diffusion region and a voltage supply line supplying a pixel power supply voltage, to adjust a first conversion gain of the first source follower transistor,
 wherein a first one of the first transistor, the second transistor, and the first reset transistor is provided in a first sub-pixel region of the first pixel together with a first photoelectric conversion element among the first group of photoelectric conversion elements,
 wherein a second one of the first transistor, the second transistor, and the first reset transistor, other than the first one of the first transistor, the second transistor, and the first reset transistor, is provided in a second sub-pixel region of the first pixel together with a second photoelectric conversion element among the first group of photoelectric conversion elements, and
 wherein the first sub-pixel region and the second sub-pixel region are separated from each other by the FDTI.

18. The image processing device of claim 17, wherein a third one of the first transistor, the second transistor, and the first reset transistor, other than the first one and the second one of the first transistor, the second transistor, and the first reset transistor, is provided in a third sub-pixel region of the first pixel together with a third photoelectric conversion element among the first group of photoelectric conversion elements, and
 wherein the second sub-pixel region and the third sub-pixel region are separated from each other by the FDTI.

19. The image processing device of claim 17, wherein a second pixel adjacent to the first pixel from among the pixels comprises:
 a second floating diffusion region;
 a second group of photoelectric conversion elements separated from each other by the FDTI;
 a second group of charge transfer transistors respectively comprising vertical transfer gates, the second group of charge transfer transistors being configured to transfer photo-generated charges generated by the second group of photoelectric conversion elements to the second floating diffusion region;
 a second source follower transistor comprising a second gate connected with the second floating diffusion region; and
 a third transistor, a fourth transistor, and a second reset transistor connected in series between the second floating diffusion region and the voltage supply line, to adjust a second conversion gain of the second source follower transistor,
 wherein a first one of the third transistor, the fourth transistor, and the second reset transistor is provided in a third sub-pixel region of the second pixel together with a third photoelectric conversion element among the second group of photoelectric conversion elements,
 wherein a second one of the third transistor, the fourth transistor, and the second reset transistor, other than the first one of the third transistor, the fourth transistor, and the second reset transistor, is provided in a fourth sub-pixel region of the second pixel together with a fourth photoelectric conversion element among the second group of photoelectric conversion elements, and
 wherein the third sub-pixel region and the fourth sub-pixel region are separated by the FDTI.

20. The image processing device of claim 19, wherein the pixel array further comprises:
 a first connection line connected between a first connection node between the first transistor and the second transistor and a third connection node between the third transistor and the fourth transistor; and
 a second connection line connected between a second connection node between the second transistor and the first reset transistor and a fourth connection node between the fourth transistor and the second reset transistor.

* * * * *